(12) United States Patent
Huang et al.

(10) Patent No.: US 11,121,235 B2
(45) Date of Patent: Sep. 14, 2021

(54) STRUCTURE AND A MANUFACTURING METHOD OF A MOSFET WITH AN ELEMENT OF IVA GROUP ION IMPLANTATION

(71) Applicant: NATIONAL TSING HUA UNIVERSITY, Hsinchu (TW)

(72) Inventors: Chih-Fang Huang, Hsinchu (TW); Jheng-Yi Jiang, Hsinchu (TW); Sheng-Hong Wang, Douliu (TW); Jia-Qing Hung, New Taipei (TW)

(73) Assignee: National Tsing Hua University, Hsinchu (TW)

( * ) Notice: Subject to any disclaimer, the term of this patent is extended or adjusted under 35 U.S.C. 154(b) by 25 days.

(21) Appl. No.: 16/521,349

(22) Filed: Jul. 24, 2019

(65) Prior Publication Data
US 2020/0035810 A1    Jan. 30, 2020

(30) Foreign Application Priority Data

Jul. 25, 2018   (TW) .................. 107125645

(51) Int. Cl.
*H01L 29/66* (2006.01)
*H01L 29/51* (2006.01)
(Continued)

(52) U.S. Cl.
CPC ...... *H01L 29/66681* (2013.01); *H01L 21/046* (2013.01); *H01L 21/049* (2013.01);
(Continued)

(58) Field of Classification Search
CPC ............... H01L 21/046; H01L 21/0475; H01L 21/0485; H01L 21/049; H01L 21/26506; H01L 21/26533; H01L 21/425; H01L 21/8213; H01L 21/823412; H01L 21/823487; H01L 29/1041; H01L 29/1054; H01L 29/1608; H01L 29/41741; H01L 29/41766; H01L 29/41783; H01L 29/517;
(Continued)

(56) References Cited

U.S. PATENT DOCUMENTS 5,939,754 A   8/1999  Hoshi
7,727,340 B2  6/2010  Chung et al.
(Continued)

FOREIGN PATENT DOCUMENTS

JP   200766944 A   3/2007
TW   200807559 A   2/2008

OTHER PUBLICATIONS

Zetterling, "Process Technology for Silicon Carbide Devices", Docent seminar, Mar. 21, 2000, 48 pages.
(Continued)

*Primary Examiner* — Stephen W Smoot
(74) *Attorney, Agent, or Firm* — Muncy, Geissler, Olds & Lowe, P.C.

(57) ABSTRACT

A structure and a manufacturing method of a metal-oxide-semiconductor field-effect transistor with an element of IVA group ion implantation are disclosed. The element of IVA group ion implantation layer is disposed in a body and close to an interface between a gate oxide layer and the body. The element of IVA group ion implantation layer is utilized to change a property of a channel of the structure.

8 Claims, 22 Drawing Sheets

(51) Int. Cl.

| | |
|---|---|
| *H01L 29/417* | (2006.01) |
| *H01L 21/265* | (2006.01) |
| *H01L 21/04* | (2006.01) |
| *H01L 29/16* | (2006.01) |
| *H01L 29/78* | (2006.01) |
| *H01L 21/82* | (2006.01) |
| *H01L 21/8234* | (2006.01) |
| *H01L 21/425* | (2006.01) |

(52) U.S. Cl.
CPC .. *H01L 21/26506* (2013.01); *H01L 21/26586* (2013.01); *H01L 21/425* (2013.01); *H01L 21/8213* (2013.01); *H01L 21/823412* (2013.01); *H01L 29/1608* (2013.01); *H01L 29/41766* (2013.01); *H01L 29/41783* (2013.01); *H01L 29/517* (2013.01); *H01L 29/66068* (2013.01); *H01L 29/66537* (2013.01); *H01L 29/7816* (2013.01)

(58) Field of Classification Search
CPC ......... H01L 29/66068; H01L 29/66492; H01L 29/66537; H01L 29/66681; H01L 29/66704; H01L 29/66734; H01L 29/7802; H01L 29/7813; H01L 29/7816; H01L 29/7825; H01L 29/7827; H01L 29/7833; H01L 29/7849
See application file for complete search history.

(56) References Cited

U.S. PATENT DOCUMENTS

| | | | |
|---|---|---|---|
| 9,984,894 B2 | 5/2018 | Dhar et al. | |
| 2004/0206951 A1* | 10/2004 | Mirabedini | H01L 21/26506 257/19 |
| 2009/0039358 A1 | 2/2009 | Tsuchida et al. | |
| 2009/0179258 A1* | 7/2009 | Otake | H01L 29/2003 257/329 |
| 2012/0187495 A1* | 7/2012 | An | H01L 29/7833 257/368 |
| 2013/0256796 A1* | 10/2013 | Sathaiya | H01L 29/66651 257/344 |

OTHER PUBLICATIONS

Fisher et al., "Towards a unified view of poytypism in SiC", Philosophical Magazine B: Physics of Condensed Matter, Feb. 1990, vol. 61, No. 2, 217-236, 20 pages.

Powell et al., "SiC Materials-Progress, Status, and Potential Roadblocks", Proceedings of the IEEE, vol. 90, No. 6, Jun. 2002, pp. 942-955, 14 pages.

Li et al., "Interfacial characteristics of $N_2O$ and NO nitrided $SiO_2$ grown on SiC by rapid thermal processing", Appl. Phys. Lett. 70 (15), Apr. 14, 1997, pp. 2028-2030, American Institute of Physics, 3 pages.

Chung et al., "Improved Inversion Channel Mobility for 4H—SiC MOSFETs Following High Temperature Anneals in Nitric Oxide", IEEE Electron Device Letters, vol. 22, No. 4, Apr. 2001, pp. 176-178, 3 pages.

Lu et al., "Effect of Process Variations and Ambient Temperature on Electron Mobility at the $SiO_2$/4H—SiC Interface", IEEE Transactions on Electron Devices, vol. 50, No. 7, Jul. 2003, pp. 1582-1588, 7 pages.

Okamoto et al., "Improved Inversion Channel Mobility in 4H—SiC MOSFETs on Si Face Utilizing Phosphorus-Doped Gate Oxide", IEEE Electron Device Letters, vol. 31, No. 7, Jul. 2010, pp. 710-712, 3 pages.

Kurimoto et al., "Thermal oxidation temperature dependence of 4H—SiC MOS interface", Applied Surface Science 253 (2006) 2416-2420, Elsevier, 5 pages.

Thomas et al., "Enhanced Field Effect Mobility on 4H—SiC by Oxidation at 1500° C.", Journal of the Electron Devices Society, vol. 2, No. 5, Sep. 2014, pp. 114-117, 4 pages.

Hosoi et al., "Ultrahigh-temperature rapid thermal oxidation of 4H—SiC(0001) surfaces and oxidation temperature depencence of SiO2/SiC interface properties", Applied Physics Letters 109, (2016) 5 pages.

Makhtari et al., "Oxidation of ion implanted silicon carbide", Materials Science in Semiconductor Processing 4 (2001) 345-349, 5 pages.

Tseng et al., "Characterization of LOCOS Field Oxide on 4H—SiC Formed by Ar Preamorphization Ion Implantation", IEEE Electron Device Letters, vol. 38, No. 6, Jun. 2017, pp. 798-801, 4 pages.

Dhar et al., "A Study on Pre-Oxidation Nitrogen Implantation for the Improvement of Channel Mobility in 4H—SiC MOSFETs", IEEE Transactions on Electron Devices, vol. 57, No. 6, Jun. 2010, pp. 1195-1200, 6 pages.

Kimoto et al., "Ion Implantation Technology in SiC for High-Voltage/High-Temperature Devices", Department of Electronic Science and Engineering, Kyoto University, 5 pages, 2016.

Negoro et al., "Electrical activation of high-concentration aluminum implanted in 4H—SiC", Journal of Applied Physics vol. 96, No. 9 (2004) American Institute of Physics, pp. 4916-4922, 7 pages.

Negoro et al., "Electronic behaviors of high-dose phosphorus-ion implanted 4H—SiC (0001)", Journal of Applied Physics vol. 96, No. 1 (2004) American Institute of Physics, pp. 224-228, 5 pages.

Song et al., "Modified Deal Grove model for the thermal oxidation of silicon carbide", Journal of Applied Physics vol. 95, No. 9 (2004) American Institute of Physics, pp. 4953-4957, 5 pages.

Radtke et al., "Characterization of SiC thermal oxidation", Nuclear Instruments and Methods in Physics Research B 190 (2002) Elsevier, 579-582, 4 pages.

Autran et al., "Characterization of Si—$SiO_2$ interface states: Comparison between different charge pumping and capacitance techniques", Journal of Applied Physics vol. 74, No. 6 (1993) American Institute of Physics, pp. 3932-3935, 4 pages.

Brugler et al., "Charge Pumping in MOS Devices", IEEE Transactions on Electron Devices, vol. ED-16, No. 3, Mar. 1969, pp. 297-302, 6 pages.

Autran et al., "Charge Pumping Techniques, Their use for diagnosis and interface states studies in MOS transistors", Instabilities in Silicon Devices, Elsevier, pp. 405-493, 89 pages, 1999.

* cited by examiner

STRUCTURE AND A MANUFACTURING METHOD OF A MOSFET WITH AN ELEMENT OF IVA GROUP ION IMPLANTATION

CROSS-REFERENCE TO RELATED APPLICATIONS

This application claims priority of No. 107125645 filed in Taiwan R.O.C. on Jul. 25, 2018 under 35 USC 119, the entire content of which is hereby incorporated by reference.

BACKGROUND OF THE INVENTION

Field of the Invention

The invention relates to a structure and a manufacturing method of a metal-oxide-semiconductor field-effect transistor with an element of IVA group ion implantation, and more particularly to a structure and a manufacturing method using an element of IVA group ion implantation to improve oxidation of 4H—SiC before oxidation of a gate oxide layer.

Description of the Related Art

In the prior art, the too low field-effect mobility (5 to 10 cm$^2$/V·s) of the silicon carbide metal-oxide-semiconductor field-effect transistor is always the major drawback of the silicon carbide element. Recently, the use of nitric oxide thermal annealing after oxidation has been developed to effectively increase the electron mobility to about 30 cm$^2$/V·s.

Hui-feng Li from Griffith University in Australia has proposed, in the year of 1997, the rapid thermal process (RTP) performed in the environment of nitric oxide (NO) and nitrous oxide (N$_2$O) after the oxidation process of the 6H—SiC metal oxygen semi-capacitor (MOSC). After the experiment, it is found that the interface trap density (D$_1$) of the MOSC measured after the NO RTP step is lower than that measured after the typical process.

In the year of 2001, G. Y. Chung. et. al from Auburn University applied this technology to the 4H—SiC horizontal type MOSFET. After oxidation and NO thermal annealing at 1175° C. and 1 atm for two hours, the electron mobility of the channel is successfully increased from 5 cm$^2$/V·s to 37 cm$^2$/V·s. The reason is that the nitrogen atoms enter the SiC/SiO$_2$ interface to form bonds with Si, and that the bonds between C and C are decreased after the bonds between Si and C are removed.

In the year of 2010, Dai Okamoto from Nara Institute of Science and Technology disclosed the new thermal annealing technology, in which the process is performed in the mixture gas of phosphorus oxychloride (POCl$_3$), nitrogen (N$_2$) and oxygen (O$_2$) in the environment of 1,000° C. for 10 minutes. Such the research has successfully increased the electron mobility of the channel to 89 cm$^2$/V·s with the aftereffect that the threshold voltage (V$_{TH}$) is suddenly decreased.

BRIEF SUMMARY OF THE INVENTION

The invention provides a structure and a manufacturing method of a metal-oxide-semiconductor field-effect transistor with an element of IVA group ion implantation to improve the quality of the gate oxide layer and enhance the field-effect mobility.

The invention is different from the prior art for increasing the electron mobility and is to implant IVA group ions on the surface of the body before the oxidation of the gate electrode to change the structure of the surface of the body and affect the oxidation phenomenon of the gate, thereby decreasing the trap density and increasing the electron mobility of the channel.

The invention provides a structure and a manufacturing method of a metal-oxide-semiconductor field-effect transistor with an element of IVA group ion implantation to change the threshold voltage (V$_{TH}$).

An embodiment of the invention discloses a structure of a metal-oxide-semiconductor field-effect transistor with an element of IVA group ion implantation. The structure includes: a body; a gate electrode, wherein a gate oxide layer is disposed between the gate electrode and the body; and an element of IVA group ion implantation layer, which is disposed in the body and is close to an interface between a gate oxide layer and the body; wherein the element of IVA group ion implantation layer is utilized to change a property of a channel of the structure.

A method of manufacturing a structure of a metal-oxide-semiconductor field-effect transistor with an element of IVA group ion implantation includes: a body implanting step of implanting an aluminum ion into a body; a source layer or drain layer ion implanting step of defining a region of a source layer or a drain layer by way of photolithography, and implanting a phosphorus ion into the source layer or the drain layer; of implanting an element of IVA group ion into a location distant from the source layer, the drain layer, or a surface of the body by a predetermined depth to form an element of IVA group ion implantation layer close to the source layer, the drain layer or the surface of the body.

DETAILED DESCRIPTION OF THE INVENTION

Figure 1:
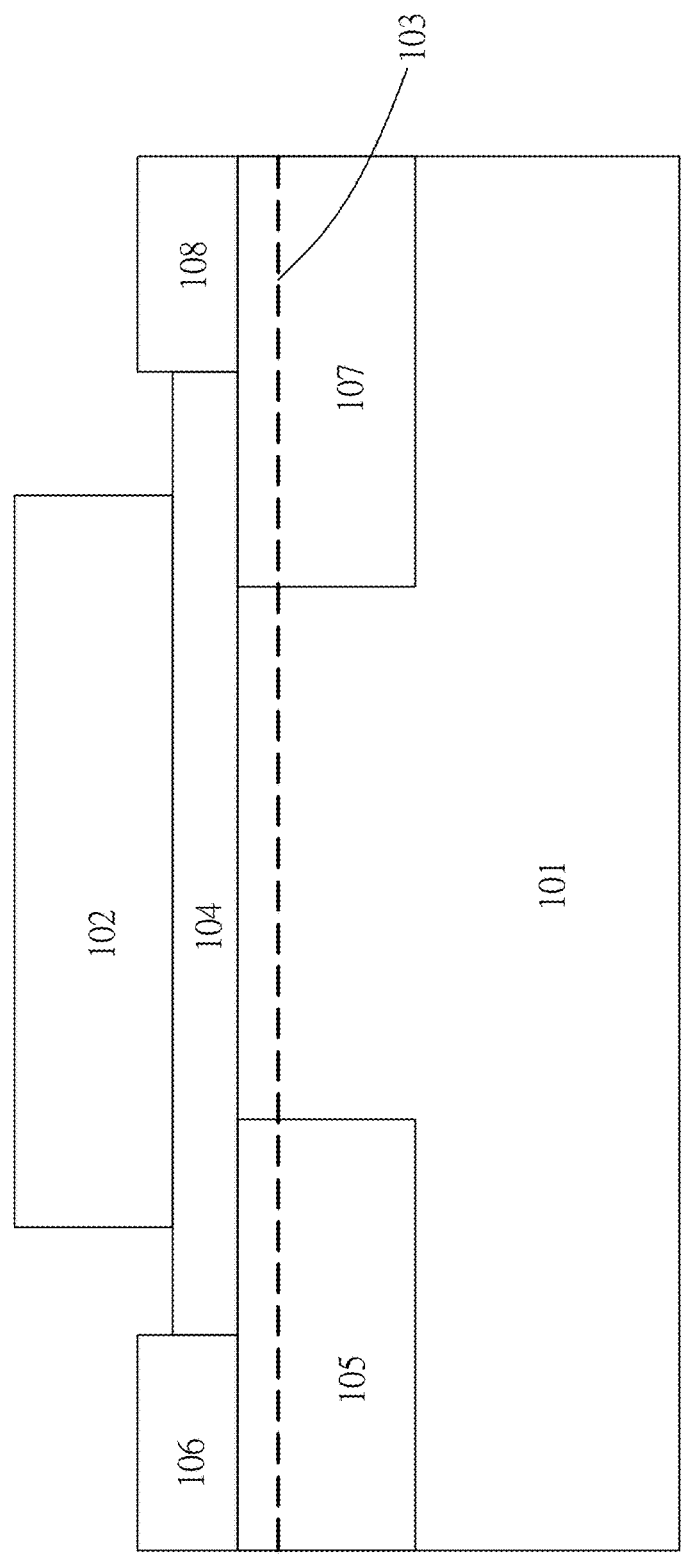
FIGS. 1 to 3 are schematic views showing an embodiment of the invention.

FIG. 1 is a schematic view showing a structure of a metal-oxide-semiconductor field-effect transistor with an element of IVA group ion implantation according to an embodiment of the invention. Referring to FIG. 1, the structure 100 includes a body 101, a gate electrode 102, an element of IVA group ion implantation layer 103, a gate oxide layer 104, a source layer 105, a source electrode 106, a drain layer 107 and a drain electrode 108.

The gate oxide layer 104 is disposed between the gate electrode 102 and the body 101. The element of IVA group ion implantation layer 103 is disposed in the body 101, and is close to the interface between the gate oxide layer 104 and the body 101, as represented by the dashed line. The element of IVA group ion implantation layer 103 is utilized to change a property of a channel. In one embodiment, the element of IVA group ion implantation layer 103 is utilized to increase the electron mobility of the channel of the structure 100, and is not disposed in the gate oxide layer 104.

In one embodiment, the IVA group ions may be implemented by the ions of carbon (C), silicon (Si), germanium (Ge), tin (Sn), lead (Pb) or flerovium (Fl).

The source layer 105 is disposed on a top surface of the body 101. The source electrode 106 disposed on a top surface of the source layer 105 and in contact with a sidewall of the gate oxide layer 104 partially covers the source layer 105. The drain layer 107 is disposed on the top surface of the body 101. The drain electrode 108 disposed on the top surface of the drain layer 107 and in contact with the other sidewall of the gate oxide layer 104 partially covers the drain layer 107.

The gate oxide layer 104 partially covers the source layer 105, partially covers the drain layer 107 and partially covers the body 101. The source layer 105 and the drain layer 107 are made of a first type semiconductor material, and the body 101 is made of a second type semiconductor material.

Please note that when the structure 100 is a NMOS transistor, the first type semiconductor material is a N-type semiconductor material, and the second type semiconductor material is a P-type semiconductor material; and when the structure 100 is a PMOS transistor, the first type semiconductor material is a P-type semiconductor material, and the second type semiconductor material is a N-type semiconductor material.

In one embodiment, the element of IVA group ion implantation layer 103 is disposed in the source layer 105 and the drain layer 107, and is close to an interface between the source layer 105 and the source electrode 106, and an interface between the source layer 105 and the gate oxide layer 104, an interface between the drain layer 107 and the drain electrode 108, and an interface between the drain layer 107 and the gate oxide layer 104.

In this structure 100, the oxidation phenomenon is affected by changing the surface structure of the body 101. When the gate oxide layer 104 encounters an oxidation reaction, the implanted IVA group ion functions as a reactant. Because no nitric oxide (NO) is possessed, the damage to the bonds of silicon carbide (hereinafter referred to as SiC) of the body 101 is decreased, so that the trap density and the electron mobility of the channel are decreased. In this embodiment, the IVA group ion is implemented by the silicon ion.

Figure 2:
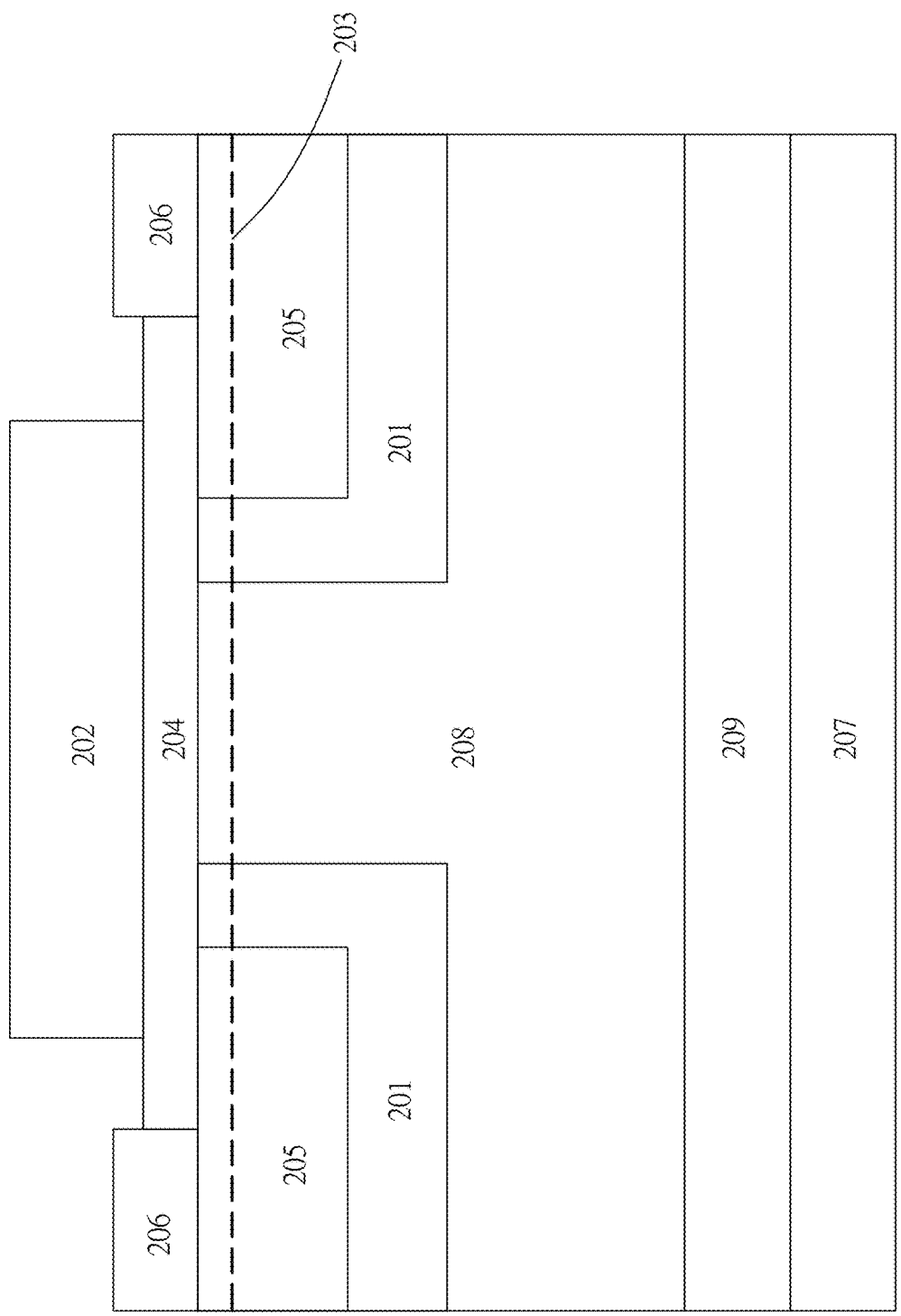

FIG. 2 is a schematic view showing a structure of a metal-oxide-semiconductor field-effect transistor with an element of IVA group ion implantation according to an embodiment of the invention. Referring to FIG. 2, the structure 200 is a vertical double-diffused metal-oxide-semiconductor field-effect transistor (Vertical DMOS).

The structure 200 includes a body 201, a gate electrode 202, an element of IVA group ion implantation layer 203, a gate oxide layer 204, a source layer 205, a source electrode 206, a drain electrode 207, a drift layer 208 and a substrate 209.

Please note that the gate oxide layer 204 is present between the gate electrode 202 and the body 201, and the element of IVA group ion implantation layer 203 is disposed in the body 201 and is close to an interface between the gate oxide layer 204 and the body 201, as represented by the dashed line.

The source layer 205 is disposed on a top surface of the body 201, and the source layer 205 is partially covered by the body 201; the source electrode 206 is disposed on a top surface of the source layer 205, is in contact with a sidewall of the gate oxide layer 204, and partially covers the top surface of the source layer 205; and the gate oxide layer 204 partially covers the top surface of the body 201 and the top surface of the source layer 205.

The drift layer 208 is disposed and in contact with the bottom surface of the gate oxide layer 204 and covers the body 201; the substrate 209 is in contact with and disposed below drift layer 208; and the drain electrode 207 is disposed below the substrate 209.

The gate oxide layer 204 also partially covers the source layer 205, partially covers the body 201 and partially covers the drift layer 208; the source layer 205, the drift layer 208 and the substrate 209 are made of a first type semiconductor material; and the body 201 is made of a second type semiconductor material. In this embodiment, the first type semiconductor material is a N-type semiconductor material, and the second type semiconductor material is a P-type semiconductor material.

The element of IVA group ion implantation layer 203 is disposed in the source layer 205 and the drift layer 208, and is close to an interface between the source layer 205 and the source electrode 206, an interface between the source layer 205 and the gate oxide layer 204, and an interface between the drift layer 208 and the gate oxide layer 204.

In one embodiment, the IVA group ion may be implemented by an ion of carbon (C), silicon (Si), germanium (Ge), tin (Sn), lead (Pb) or flerovium (Fl).

Figure 3:
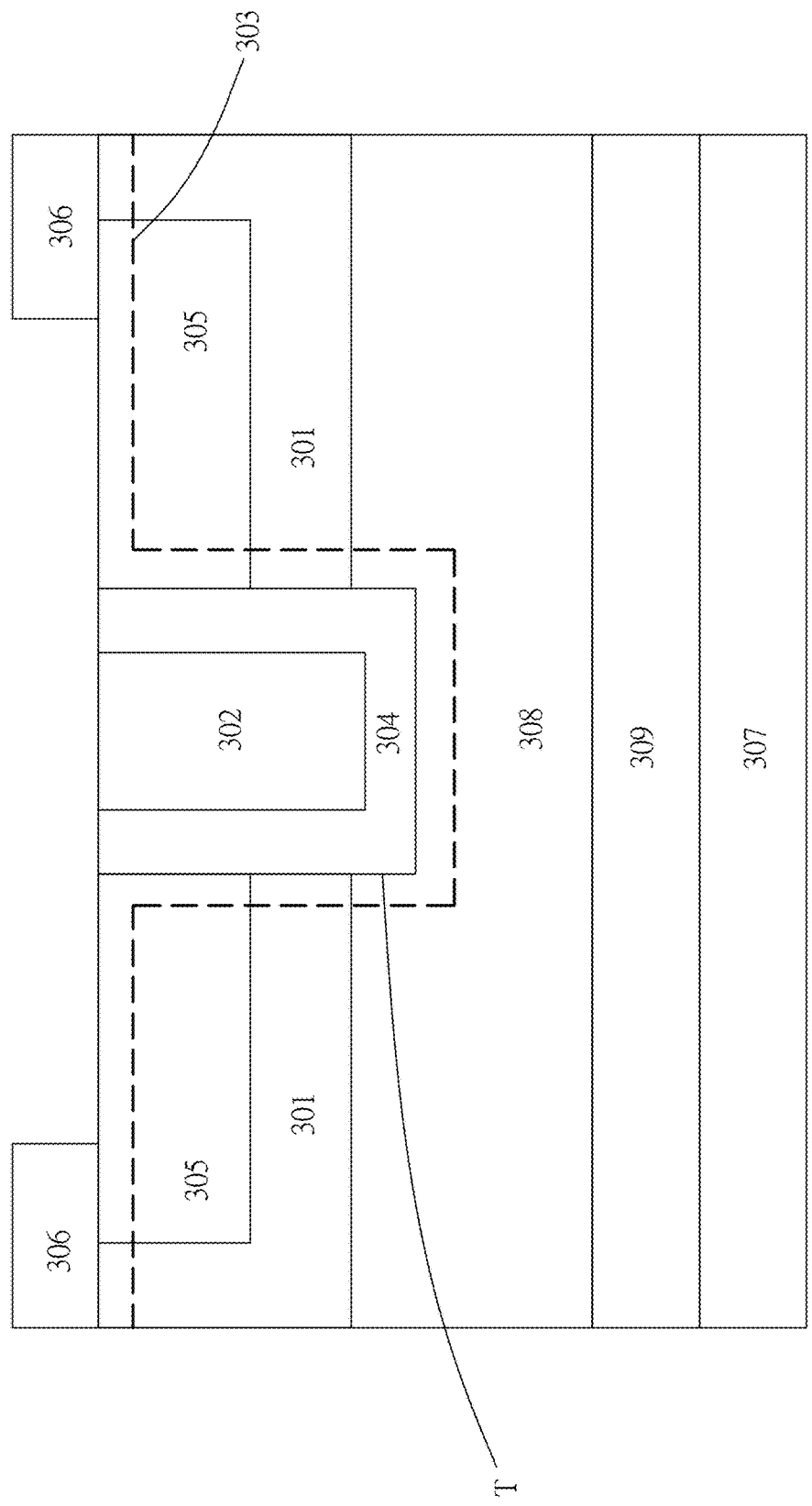

FIG. 3 is a schematic view showing a structure of a metal-oxide-semiconductor field-effect transistor with an element of IVA group ion implantation according to an embodiment of the invention. Referring to FIG. 3, the structure 300 is a vertical U-grooved metal-oxide-semiconductor field-effect transistor (Vertical UMOS).

The structure 300 includes a body 301, a gate electrode 302, an element of IVA group ion implantation layer 303, a gate oxide layer 304, a source layer 305, a drift layer 308 and a substrate 309. Also, the structure 300 has a metal layer disposed on a top surface and a bottom surface of the structure 300 to form a source electrode 306 and a drain electrode 307.

The substrate 309 is disposed on the drain electrode 307; the drift layer 308 is disposed above the substrate 309; the body 301 is disposed above the drift layer 308; the source layer 305 is disposed above the body 301; the trench T extends through the body 301 and the source layer 305, a bottom portion of the trench T terminates at the drift layer 308, the gate oxide layer 304 is disposed in the trench T, and the gate electrode 302 is covered by the gate oxide layer 304.

The gate oxide layer 304 partially covers the source layer 305, partially covers the body 301 and partially covers the drift layer 308. The source layer 305, the drift layer 308 and the substrate 309 are made of a first type semiconductor material. The body 301 is made of a second type semiconductor material. The element of IVA group ion implantation layer 303 is disposed in the source layer 305 and the drift layer 308 and is close to an interface between the body 301 and the source electrode 306, an interface between the source layer 305 and the source electrode 306, an interface between the source layer 305 and the gate oxide layer 304, and an interface between the body 301 and the gate oxide layer 304, and an interface between the drift layer 308 and the gate oxide layer 304.

Figure 5A:
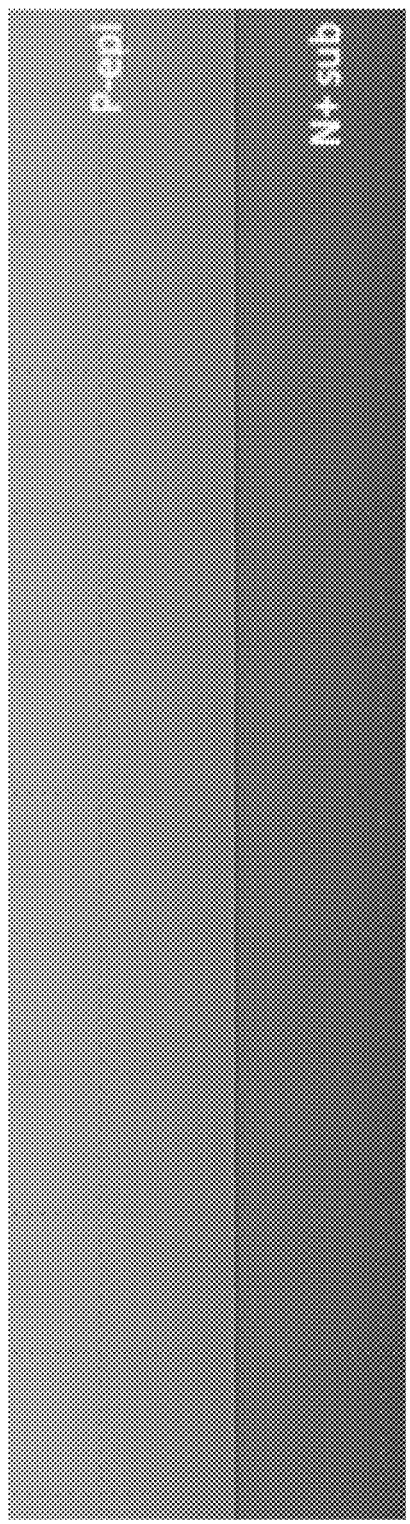
FIGS. 5a to 5d show an experimental flow chart.

Next, the manufacturing method of the structure of the invention will be explained, wherein the Si-ion implantation serves as an embodiment. In the metal-oxide-semiconductor field-effect transistor (MOSFET) element of the invention, 4H—SiC silicon carbide substrate is adopted, wherein the concentration is $1\times10^{20}$ cm$^{-3}$, and a P-type epitaxial layer (epi layer) is grown on the substrate with the concentration of $6\times10^{15}$ cm$^{-3}$ and the thickness of 5 μm, as shown in FIG. 5a. Because the SiC material is disadvantageous to diffusion, the source, the drain and the body of the invention need to use the ion implantation technology, and the gate oxide layer is grown by the thermal oxidation technology. At last, the electrodes are plated by way of thermal evaporation to finish the element.

Figure 4:
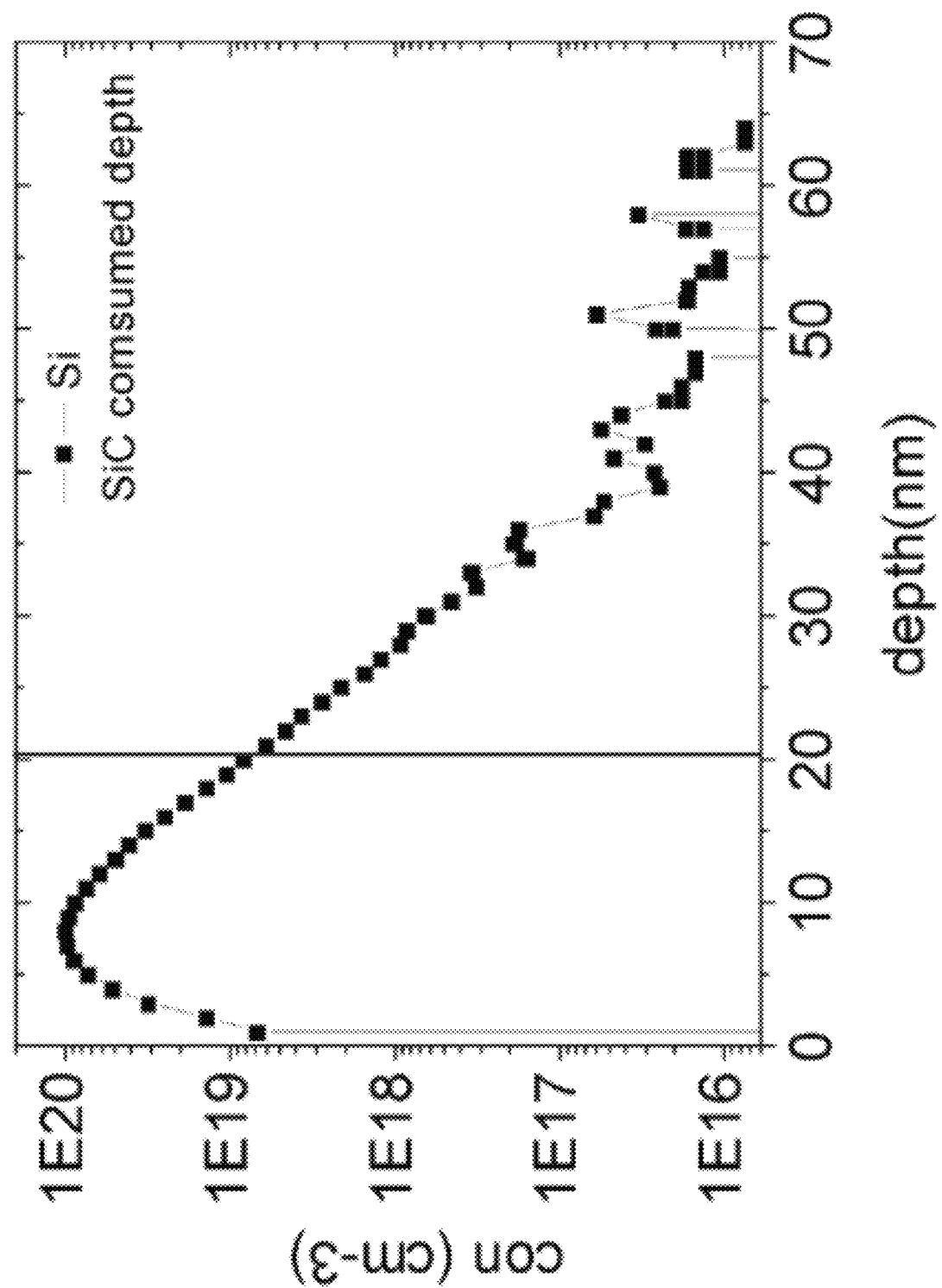
FIG. 4 is a graph showing the Si ion implantation concentration versus the depth.

An objective of the invention is to change the surface structure of SiC, and to observe whether the oxidation difference of SiC is caused. Because the annealing process after the implantation is no longer needed, the Si ion implantation needs to be performed with the low energy to prevent the surface roughening, which affects the property of the element. In addition, the implanted Si ion is only left on the surface layer. The parameters are determined as those listed in Table 1 by Silvaco simulation, wherein the simulated depth is about 60 nm, and FIG. 4 shows the graph of the implantation concentration of the Si ion versus the depth.

TABLE 1

Si ion implantation parameter

| Energy (keV) | 5 | 6 |
|---|---|---|
| Dose (cm$^{-2}$) | $3 \times 10^{13}$ | $7 \times 10^{13}$ |

In this invention, the N-type 4H—SiC substrate is adopted, and the P-type epitaxial layer with the concentration of $6\times10^{15}$ cm$^{-3}$ and the thickness of 5 μm is grown on the N-type 4H—SiC substrate. Table 2 lists the order of the masks used in this experiment, and FIGS. 5a to 5d show the experimental flow charts.

TABLE 2 experimental mask number

| Mask | Process |
|---|---|
| Mask #1. | alignment key |
| Mask #2. | body ion implantation |
| Mask #3. | source drain ion implantation |
| Mask #4. | element isolation region |
| Mask #5. | source drain Ohmic contact |
| Mask #6. | body Ohmic contact |
| Mask #7. | gate metal and pad metal |

A basic cleaning process needs to be performed before the manufacturing process, and the objective thereof is to clean the metal ion and organic substance on the surface. Typically, the first cleaning step is the immersion into the catalyzed solution containing 100 ml of sulfuric acid (H$_2$SO$_4$) and 100 ml of hydrogen peroxide (H$_2$O$_2$) for 10 minutes. This step can clean the metal particles and organic substances on the surface. The second step is the immersion into the oxide layer etchant (BOE) for 10 minutes. This step can remove the native oxide layer. The rinsing of deionized water (DI water) for three to five minutes needs to be performed after each step to avoid the residues, and then dried by the nitrogen gun, as shown in FIG. 5a.

The alignment key is defined and the photolithography is performed. The photolithography includes a step (a) of spin coating a photoresist (e.g., LOR photoresist) with the rotation parameter of 3,000 revolutions for 45 seconds, soft baking at 170° C. for 5 minutes, and then using the S1813 photoresist with the rotation parameter of 5,000 revolutions for 30 seconds, and soft baking at 90° C. for 3 minutes to finish the photoresist spin coating.

In a step (b), an exposure machine performs the alignment, wherein a specimen is placed on the exposure machine and the photolithography alignment is performed. After the alignment, the exposure development is performed, wherein the parameters include the exposure for 19 seconds and the development for 24 seconds. A microscope is used to confirm that the graphic pattern is correct and then hard baking is performed at 120° C. for 5 minutes to finish the photolithography.

Mask #1 is used to perform the photolithography. After that, the residual photoresist thereon is kept, and reactive ion etching (RIE) is performed to etch and define the SiC on the surface to finish the alignment key, wherein the photoresist can protect other portions from being damaged by the RIE, and then the photoresist is cleaned.

The step of cleaning the photoresist includes the immersion into acetone (ACE) for 10 minutes and isopropanol (IPA) for 10 minutes, and the PG remover solution water-heated to 90° C. for 10 minutes.

Body implantation is performed. First, a layer of silicon dioxide with the thickness of about 1 μm is deposited on the specimen by performing a plasma enhanced chemical vapor deposition (PECVD) once, and can function as an ion implantation stop layer in a non-defined region. Mask #2 is used to perform the photolithography to define a body region, the silicon dioxide in the body region is etched by way of RIE, the photoresist is removed from the surface after etching ends, and then the ion implantation is performed. The implantation method is the high-temperature (650° C.) aluminum (Al) ion implantation, wherein the energy and dosage are listed in Table 3. After implantation ends, the BOE solution is used to remove the silicon dioxide from the specimen.

TABLE 3

Al ion implantation parameter

| | Energy (keV) | | | | |
|---|---|---|---|---|---|
| | 160 | 100 | 60 | 30 | 10 |
| Dose (cm$^{-2}$) | $1.53 \times 10^{16}$ | $3.6 \times 10^{15}$ | $4.5 \times 10^{15}$ | $2.7 \times 10^{15}$ | $1.2 \times 10^{15}$ |

Figure 5B:
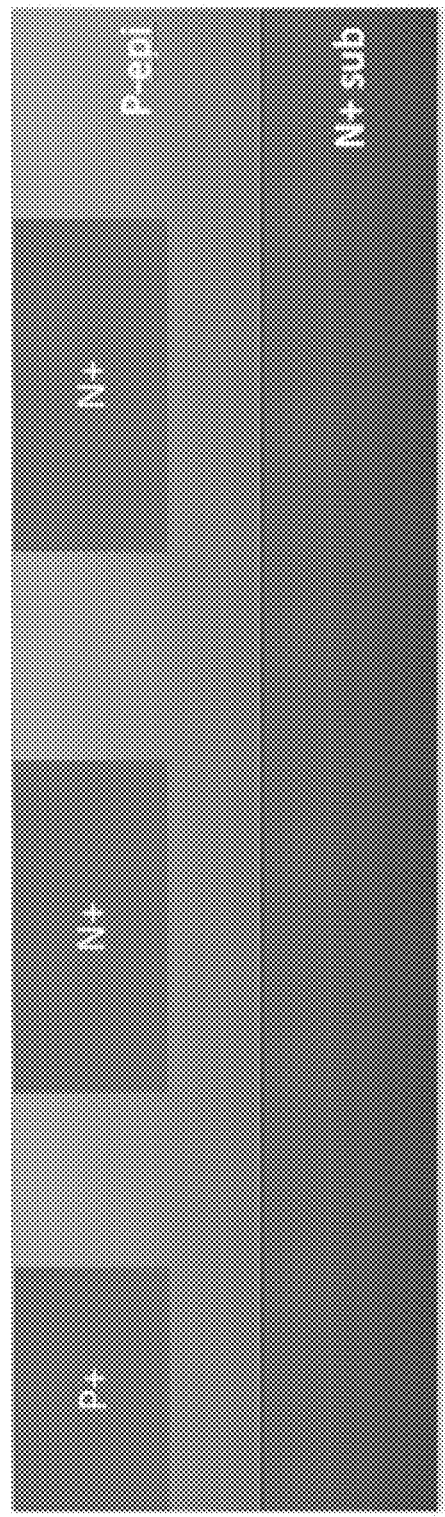

Source and drain ion implantations are performed. A layer of silicon dioxide with the thickness of about 1 μm is deposited on the specimen by performing the PECVD once. Mask #3 is used to perform the photolithography to define source and drain regions, the silicon dioxide thereon is etched by way of RIE, the photoresist is removed from the surface by way of etching, and ion implantation is performed after the processing. The implantation method is the high-temperature (650° C.) phosphorus (P) ion implantation, and the energy and dosage are listed in Table 4. After implantation ends, the silicon dioxide is removed from the specimen using the BOE solution, wherein the cross-sectional view after the body, source and drain ion implantations are finished is shown in FIG. 5b.

TABLE 4

P ion implantation parameter

| | Energy (keV) | | | | |
|---|---|---|---|---|---|
| | 160 | 100 | 60 | 30 | 10 |
| Dose (cm$^{-2}$) | 5.2 × 10$^{15}$ | 2.1 × 10$^{15}$ | 1.3 × 10$^{15}$ | 1.08 × 10$^{15}$ | 3.2 × 10$^{14}$ |

Electrical activation is performed in the ultra-high temperature (1650° C.) argon gas environment continuously for 30 minutes. Nevertheless, in the so high-temperature environment, the SiC surface forms the molten state to cause volatilization, so a carbon film (graphite cap) needs to cover the specimen before the electrical activation to avoid the volatilization. The photoresist S1813 is spin-coated on the specimen. After the spin coating, hard baking is directly performed at 120° C. for 5 minutes. The specimen is placed into the furnace at 800° C. in the argon gas environment for 30 minutes to form the carbon film. After activation, the specimen is placed into the furnace at 900° C. in the oxygen environment for 30 minutes to make the surface carbon film perform the oxidation reaction to generate CO or $CO_2$, so that the surface carbon film is removed.

Figure 5C:
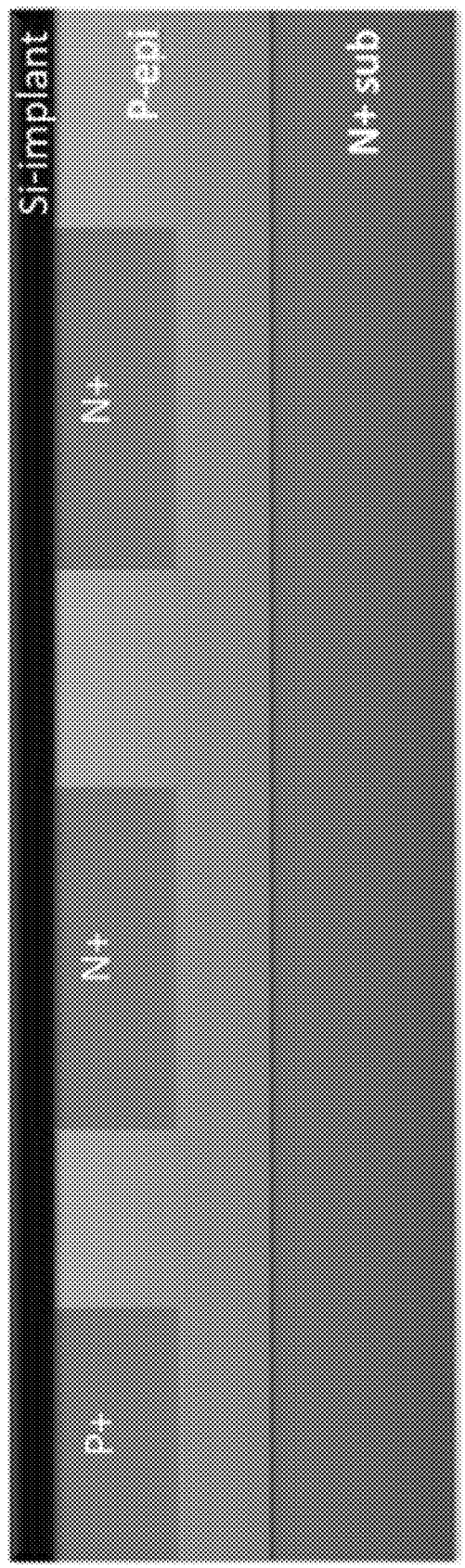

The overall-surface high-temperature (650° C.) silicon ion implantation is adopted. Due to the experimental design, the implantation depth needs to be controlled near the surface, so the Silvaco simulation is firstly adopted. At last, the determined energy and dosage are listed in Table 1, the simulation result is shown in FIG. 4, and the ion implantation depth falls near 60 nm, as shown in FIG. 5c.

In order to prevent the leakage current from being caused between the elements after implantation, an element isolation region having a width of 5 μm is designed and formed by way of etching. Mask #4 is used to perform photolithography to define the isolation region, the SiC is etched by a depth of about 148 nm by way of RIE, and then the photoresist is removed after etching.

The gate oxidation is performed. Before oxidation, the RCA clean is performed on the specimen. This step can remove all the particles, organic substances and metal ions from the surface of the specimen, so that the oxidation of the specimen is kept in the purest state. The processes of the RCA clean are described in the following.

The specimen is immersed into the mixed solution of the sulfuric acid ($H_2SO_4$) and hydrogen peroxide ($H_2O_2$) for 10 minutes.

The specimen is immersed into the BOE solution for 5 minutes.

The specimen is immersed into the ammonia water ($NH_4OH$) solution for 10 minutes, wherein this step needs the water heating until the solution reaches the temperature of 90° C.

The specimen is immersed into the BOE solution for 1 minute.

The specimen is immersed into the hydrochloric acid (HCL) solution for 10 minutes, wherein this step needs the water heating until the solution reaches the temperature of 90° C.

The specimen is immersed into the BOE solution for 1 minute.

Figure 5D:
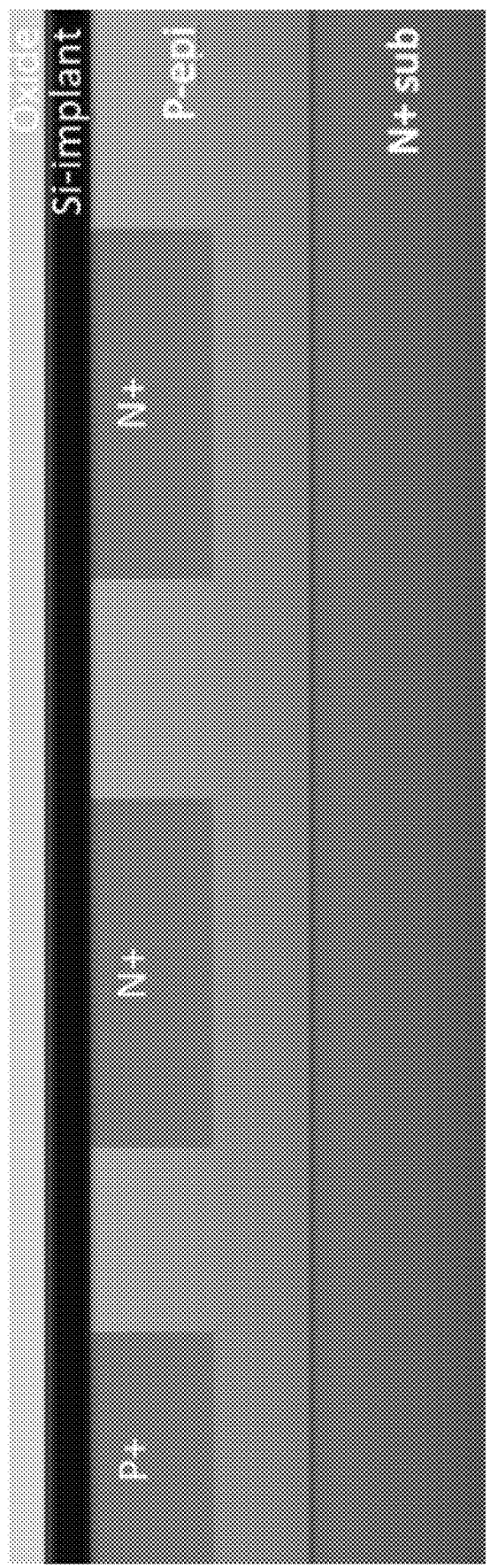

The oxidation parameter is dry oxygen at 1150° C. for 6 hours, as shown in FIG. 5d.

The source and drain Ohmic contacts are formed. Mask #5 is used to perform the photolithography to define the source and drain regions, and the oxide layer thereon is etched by way of RIE, wherein the selection of RIE has the advantage that the RIE is non-isotropic etching and can prevent the side-etching from affecting the channel length. The Ohmic contact metal titanium (Ti) and nickel (Ni) are evaporated by way of thermal evaporation, wherein the titanium metal is to increase the metal adhesion and the nickel metal provides the Ohmic connection point and prevents the metal from reacting with the oxygen in the air in the subsequent high-temperature thermal annealing. The metal has the thicknesses of 200 Å/1000 Å. Then, other metals are removed by way of lift-off.

The body Ohmic contact (body contact) is formed. Mask #6 is used to perform the photolithography to define the body contact region, and then the oxide layer thereon is removed by way of RIE. The P-type semiconductor Ohmic contact has the higher difficulty, and the used metals are titanium, aluminum and nickel, wherein aluminum can increase the Ohmic connection points, and the metals respectively have the parameters of 200 Å/1200 Å/1000 Å. Then, the other metals are removed by way of lift-off.

Rapid thermal annealing (RTA) is performed. The metal needs the high-temperature thermal annealing to have the better Ohmic contact property. The rapid thermal annealing has the parameters of 1,000° C. and 3 minutes, and needs to be performed in the vacuum environment to prevent the metal from reacting with the air to affect the Ohmic property.

Mask #7 is used to perform the photolithography on the gate metal and the pad metal to define the region, and then thermal evaporation is performed to evaporate the metal titanium and aluminum having the thicknesses of 200 Å/3500 Å, wherein the increase of the thickness is to prevent the probe from puncturing the metals upon measurement to affect the measurement result. The finally obtained horizontal MOSFET element.

Figure 6A:
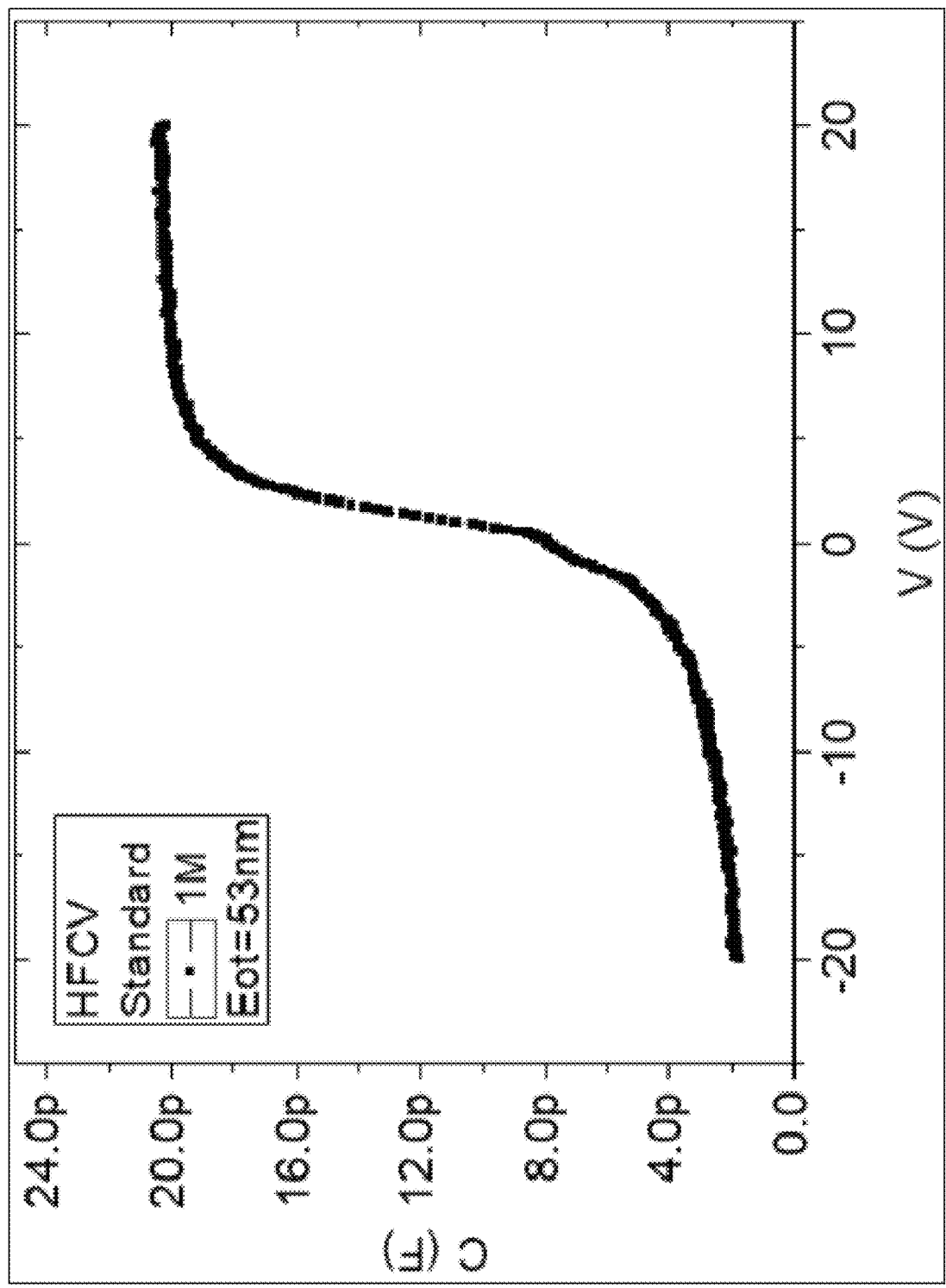
FIGS. 6a and 6b are CV graphs obtained in a capacitor having a measured diameter of 200 μm.
Figure 6B:
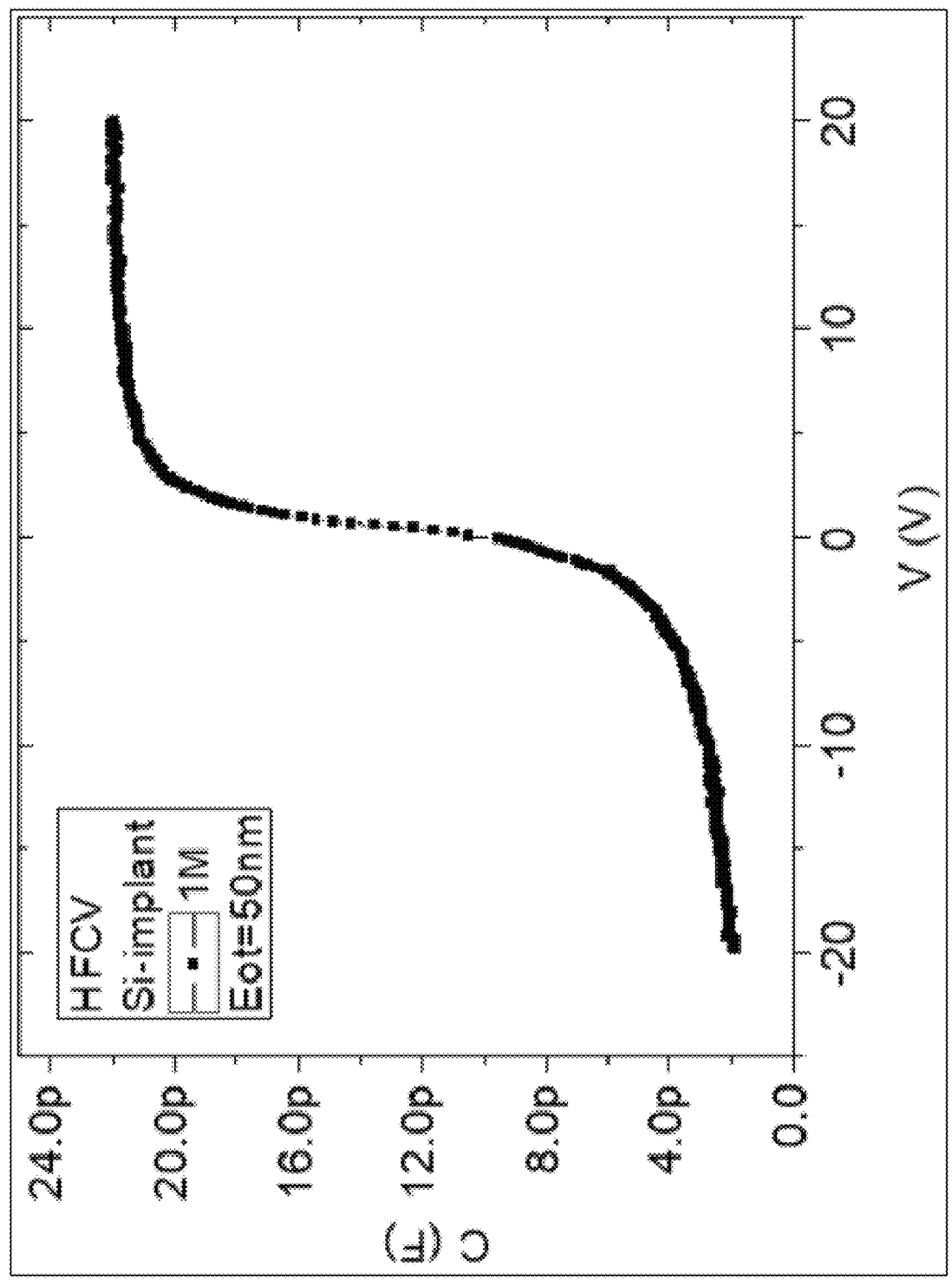

The vertical capacitance measurement is performed. In the capacitance-voltage (CV) measurement of the MOSC, the high-frequency (1 MHz) measurement is performed, so that the cumulative layer capacitance ($C_{ox}$) can be converted into the equivalent thickness of the oxide layer ($E_{OT}$), wherein the conversion equation is shown in Equation 1.

$$E_{OT} = \frac{\epsilon_{ox}}{C_{ox}/A} \quad \text{(Equation 1)}$$

where $\epsilon_{ox}$ denotes the dielectric constant of the silicon dioxide, and A denotes the area. FIGS. 6a and 6b are CV graphs obtained after the capacitor having the diameter of 200 μm is measured, wherein the converted equivalent oxide-layer thicknesses are respectively 53 nm and 50 nm, wherein FIG. 6a shows that of the conventional standard process, and FIG. 6b shows that of the silicon ion implantation process of the invention. The two processes do not have too large difference between the thicknesses of the oxide layers. The reason resides in that the implantation energy is extremely low, so the surface lattice is integral, and this does not provide too much assistance to the increase of the oxidation rate.

Figure 6C:
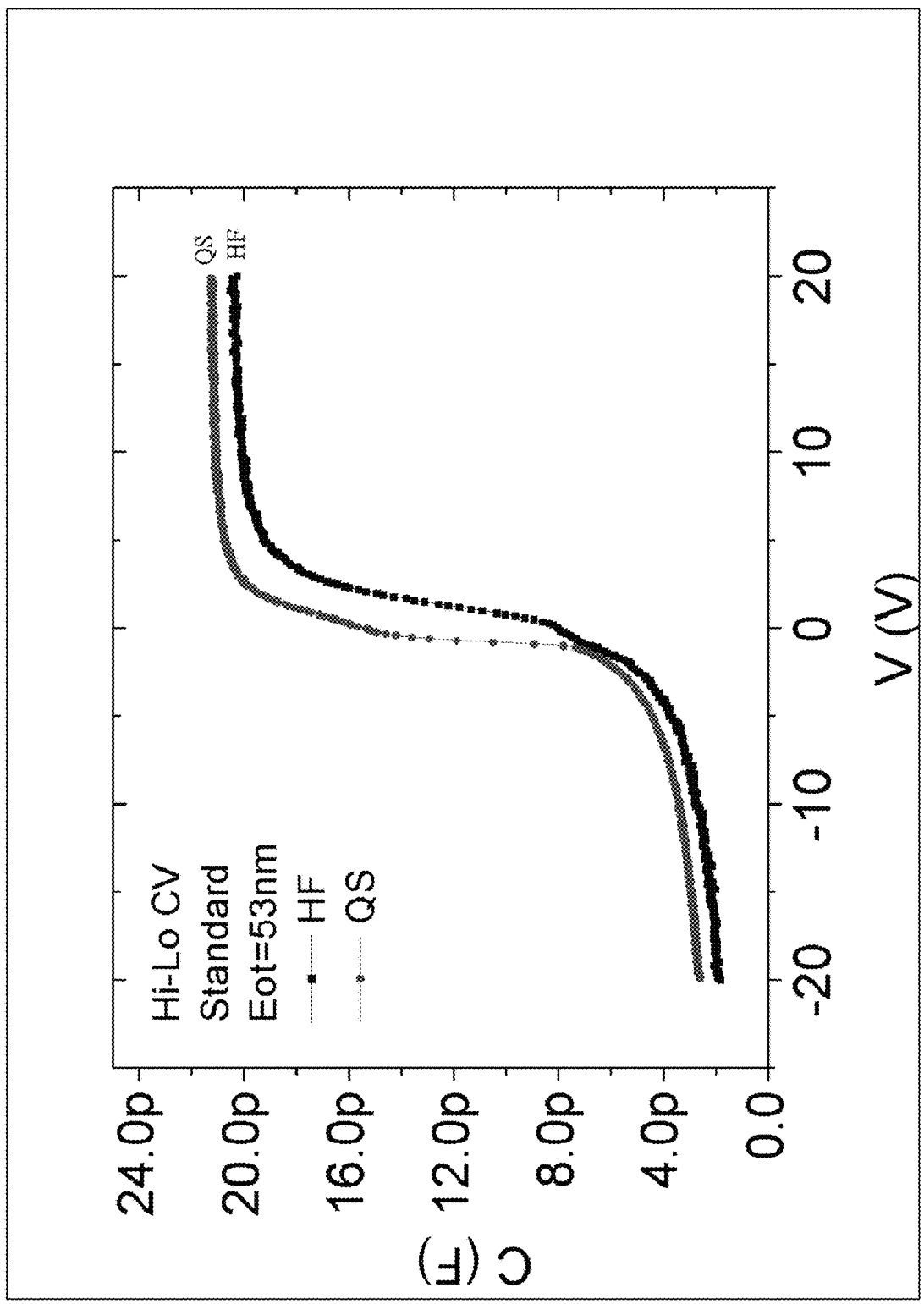
FIGS. 6c and 6d show Hi-Lo CV measurement graphs.
Figure 6D:
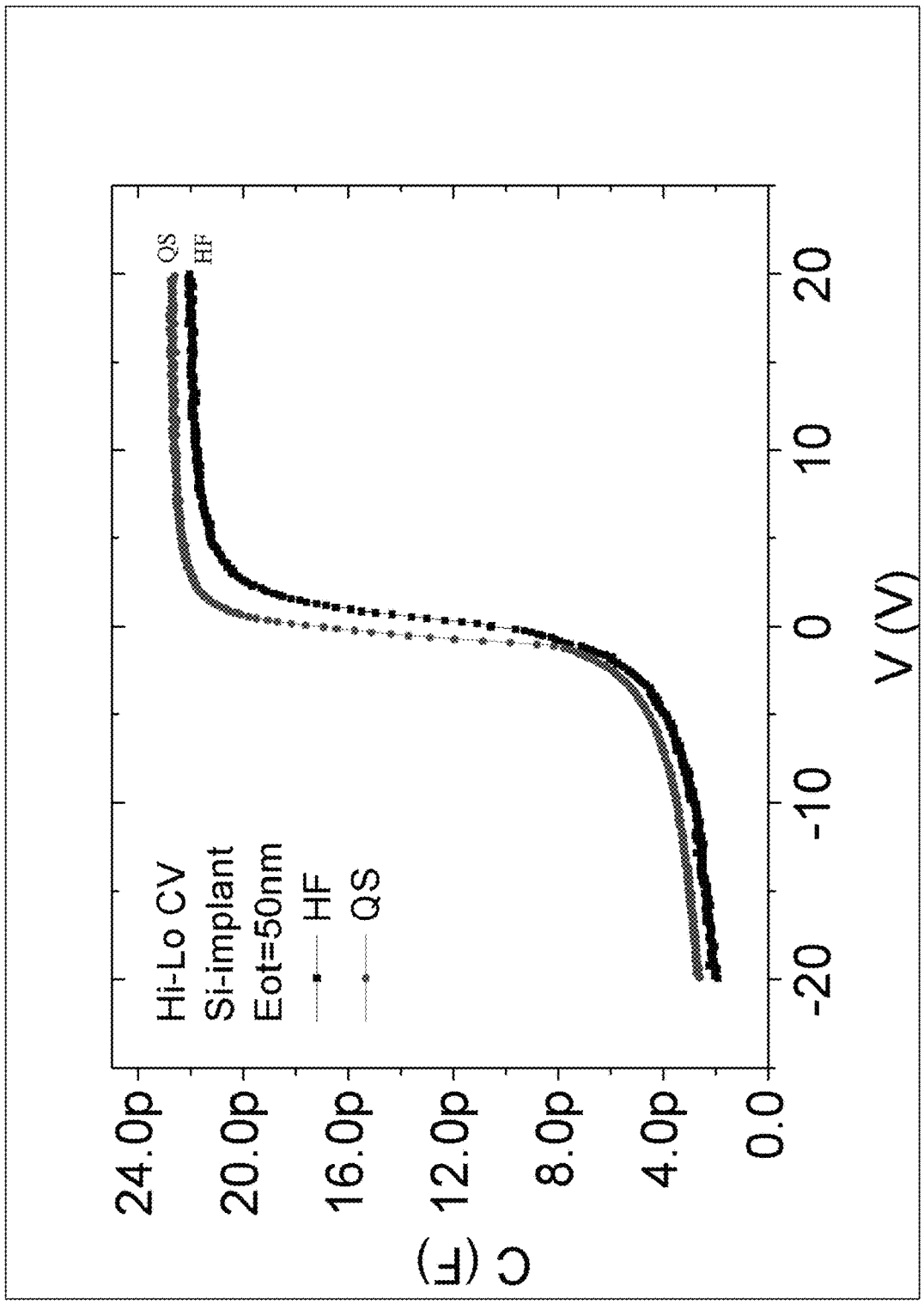
Figure 6E:
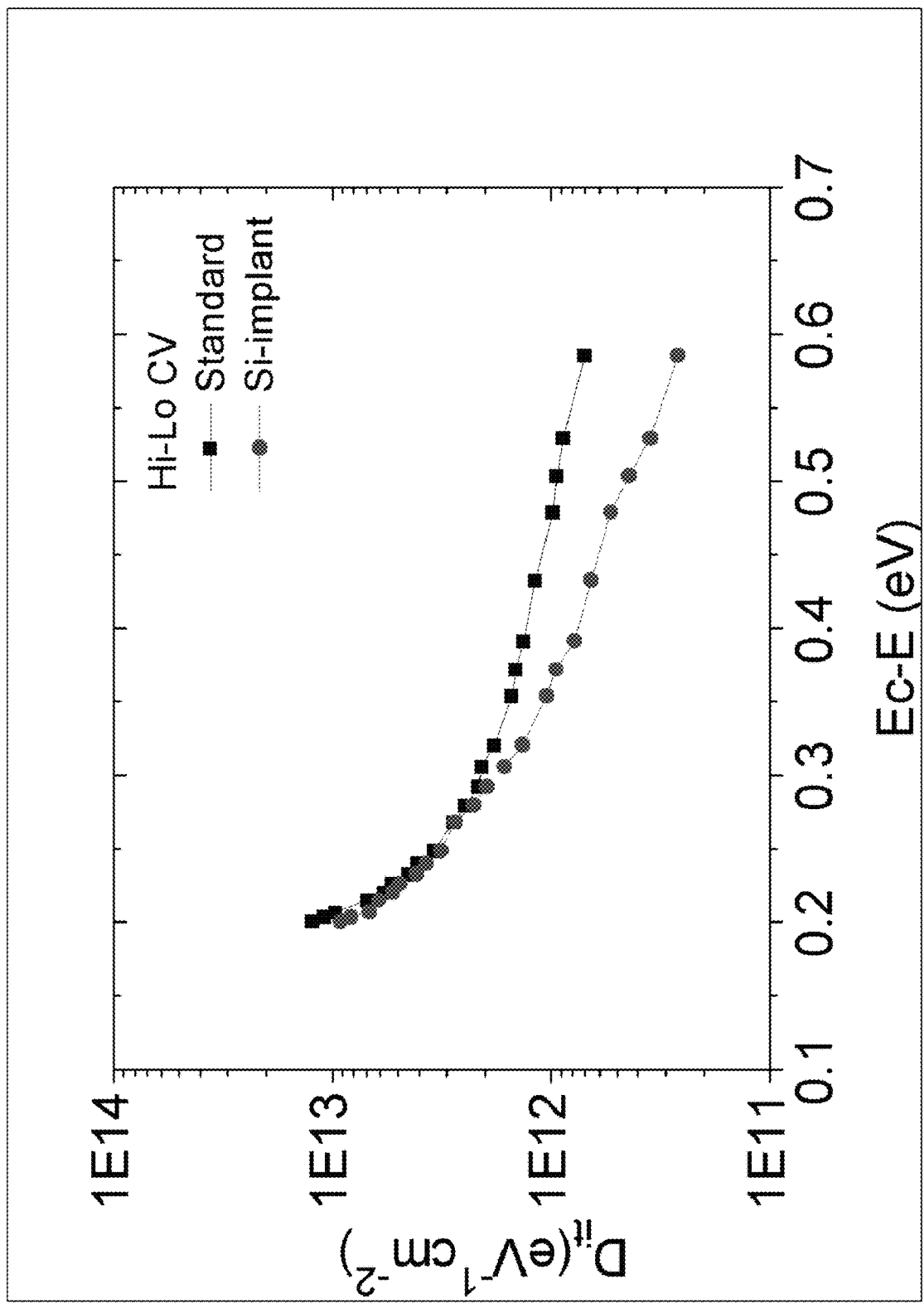
FIG. 6e is a distribution graph showing D$_{it}$ positions obtained by Hi-Lo conversion.
Figure 6F:
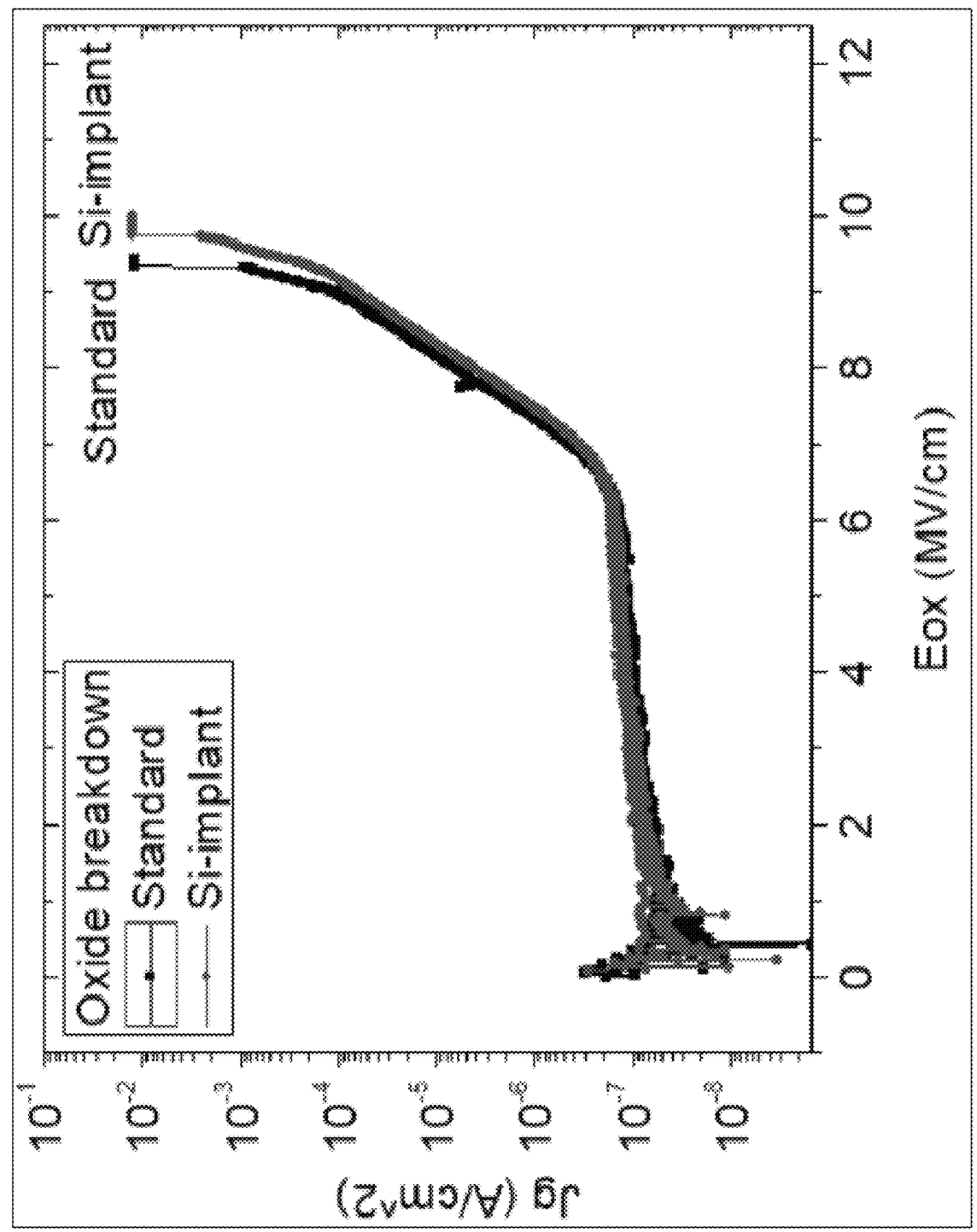
FIG. 6f is a graph showing the current density-electric field (J$_g$-ε$_{ox}$).
Figure 6G:
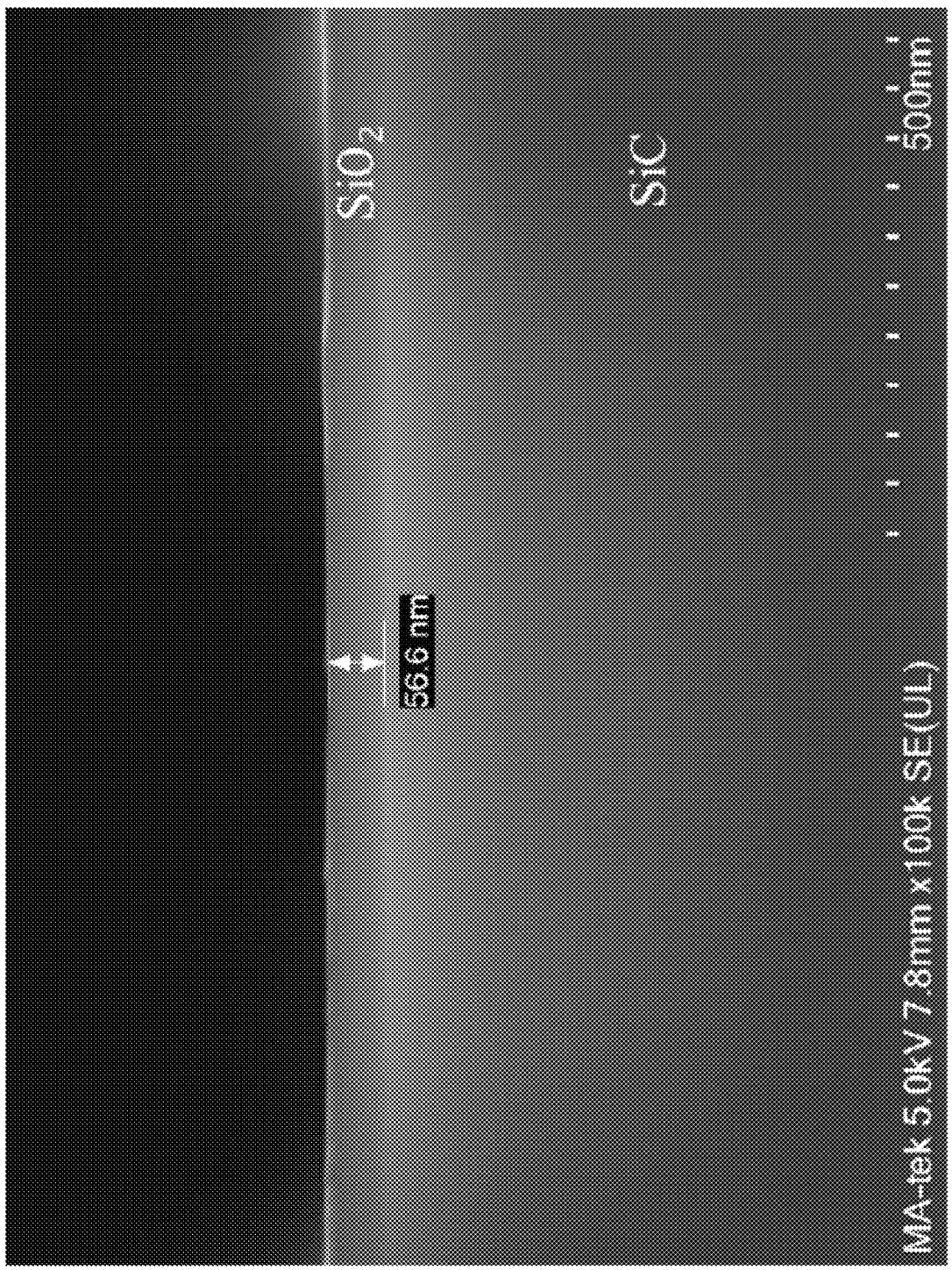
FIGS. 6g and 6h show the actual oxide thickness by SEM measurement.
Figure 6H:
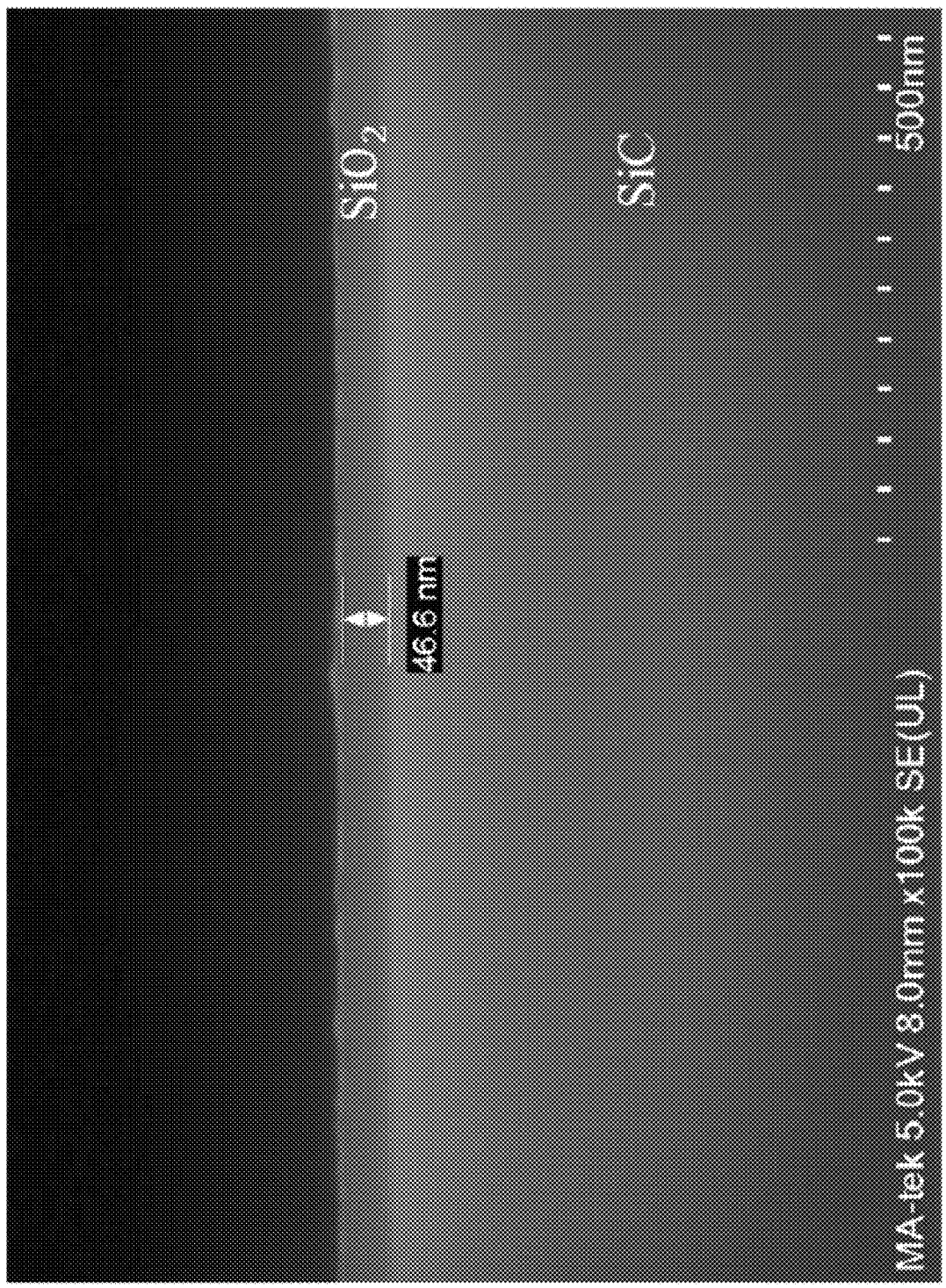

The Hi-Lo CV measurements are shown in FIGS. 6c and 6d, wherein FIG. 6c shows that of the technological standard process, and FIG. 6d shows that of the silicon ion implantation process of the invention, wherein the high-frequency measurement frequency is 1 MHz, the voltage in the quasistatic CV measurement step is 0.1 V/s, and the converted graph of $D_{it}$ versus the bandgap position is shown in FIG. 6e. As shown in the drawing, it is obtained that, when the distance to the conductive band is smaller than 0.3 eV, the $D_{it}$ of the specimen after the silicon ion implantation process is significantly lower than that of the specimen after the standard process. It is proved that the silicon ion implantation process can decrease the interface trap density. Regarding the oxide layer voltage-withstanding measurement, the equivalent thickness of the oxide layer obtained according to the CV measurement is about 50 nm, and the limiting current is set as 1 μA for the voltage-withstanding measurement. FIG. 6f is the current density-electric field ($J_g$-$\varepsilon_{ox}$) graph for two processes, wherein the FN leakage current starts when the maximum electric field reaches 6 MV/cm, and it is proved that the structural strength of the oxide layer does not deteriorate after the Si ion implantation. Finally, the SEM measurement is used to observe the actual thickness of the oxide layer, and the results are shown in FIGS. 6g and 6h, wherein FIG. 6g shows that for the conventional standard process, FIG. 6h shows that for the silicon ion implantation process of the invention, and the actual thicknesses are respectively 56 nm and 46 nm.

The forward current measurement is performed. In this embodiment, the measurement is performed on the element having the channel length of 5 μm, and includes the drain-current to gate-voltage measurement ($I_d V_g$) and the drain-current to drain-voltage measurement ($I_d V_d$).

When the drain-current to gate-voltage is measured, an extremely low voltage needs to be applied to the drain ($V_d$=0.1V), so that the equation of the drain current can be simplified as Equation 2. In addition, taking the derivative of $I_d$ with respect to $V_g$ in the $I_d V_g$ graph can obtain the transconductance ($g_m$), Equation 3, and the threshold voltage is calculated using the tangent equation at the maximum ($g_{m,MAX}$), wherein the field-effect mobility ($\mu_{FE}$) is determined according to Equation 4.

$$I_d = \mu_{FE} \times C_{ox} \times W/L \times V_d \quad \text{(Equation 2)}$$

$$g_m = \frac{\partial I_d}{\partial V_g} \quad \text{(Equation 3)}$$

$$\mu_{FE} = \frac{L \times g_m}{W \times C_{ox} \times V_d} \quad \text{(Equation 4)}$$

Figure 7A:
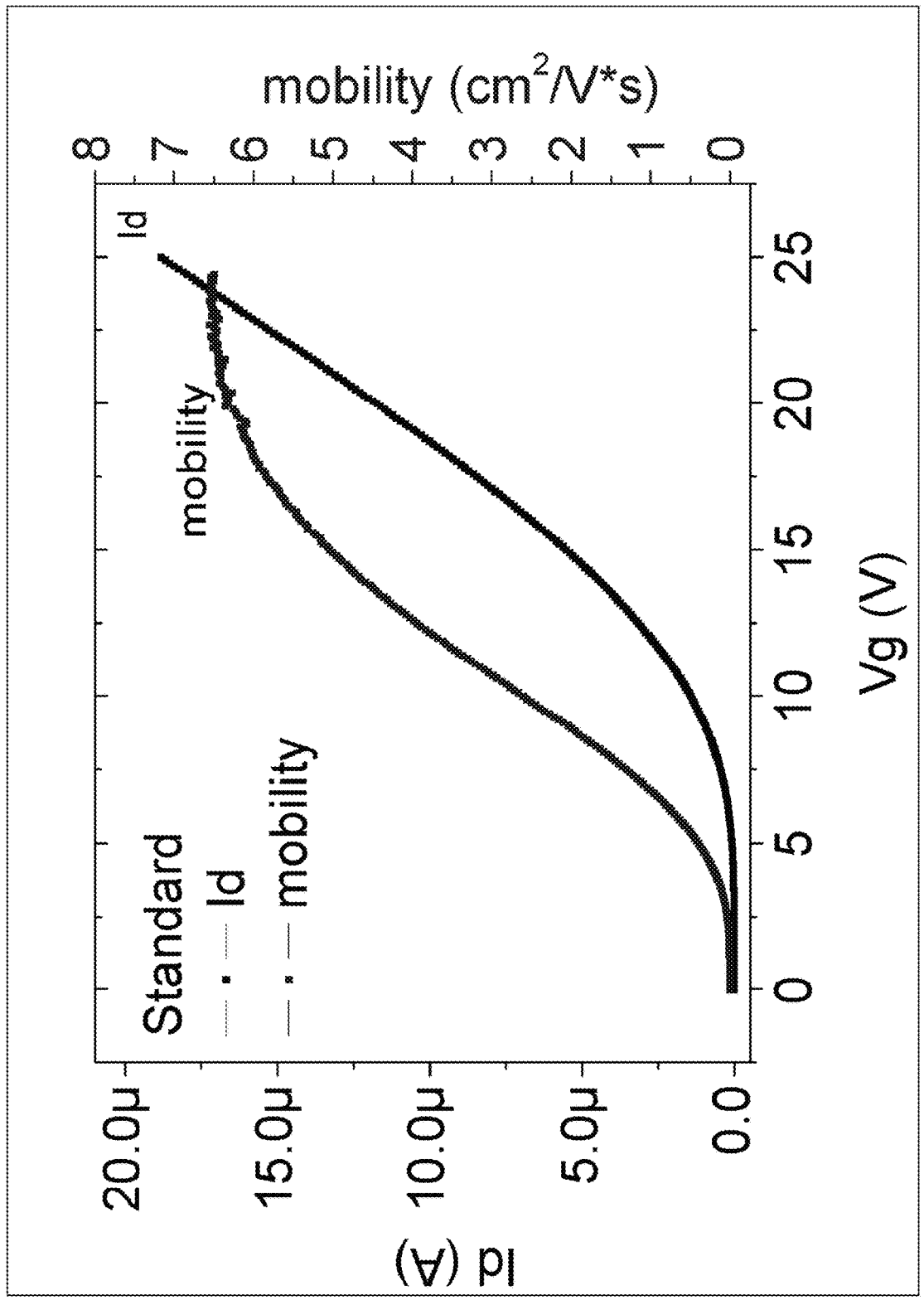
FIGS. 7a to 7d show measurement results of I$_d$V$_g$ and I$_d$V$_d$ of the element.
Figure 7B:
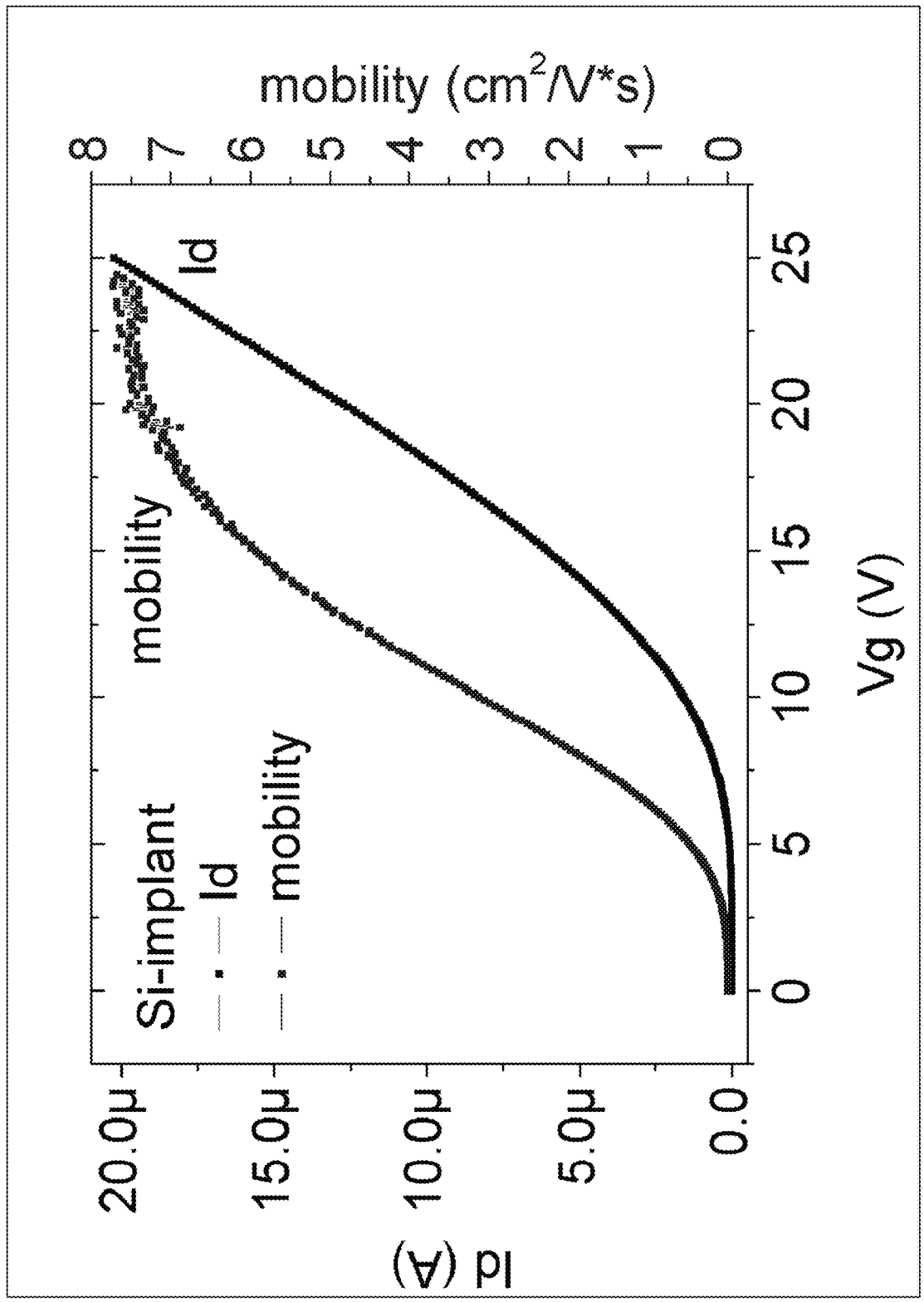
Figure 7C:
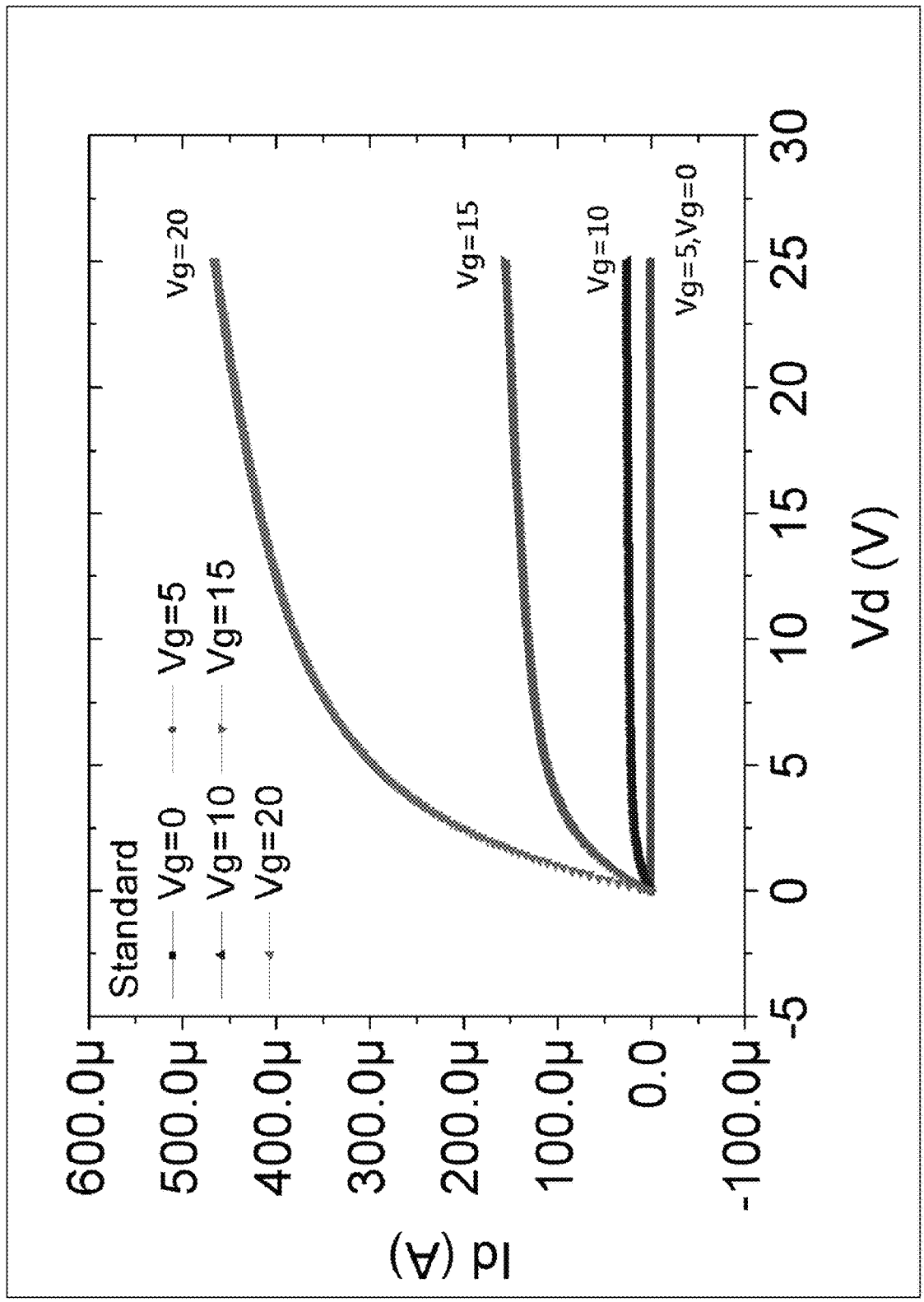
Figure 7D:
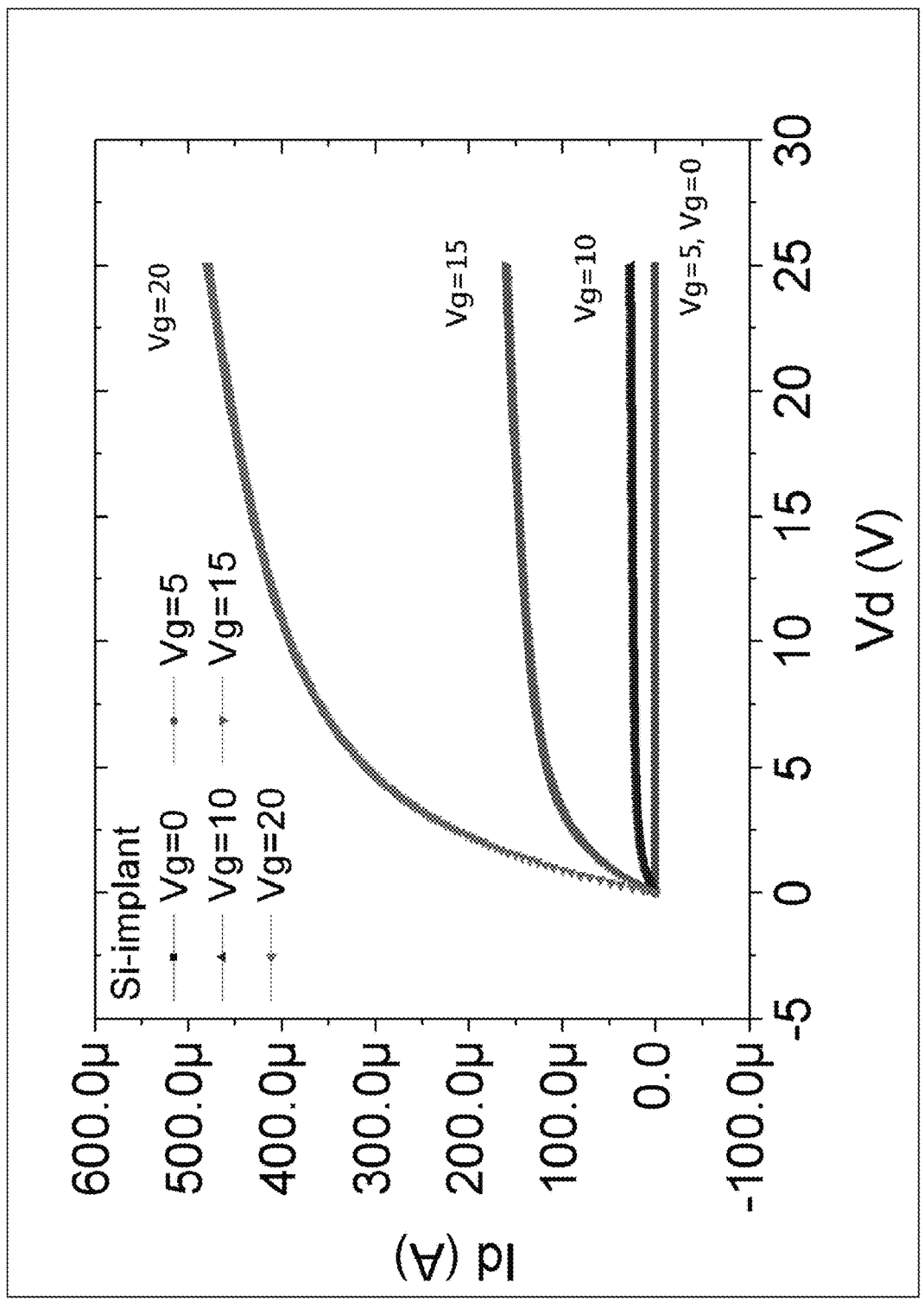

Table 5 lists the arranged measurement results, wherein the specimen for the standard process has the average field-effect mobility of 6.38 cm²/V·s, and the specimen for the Si ion implantation before oxidation has the average field-effect mobility increased to 7.59 cm²/V·s, wherein there is about 15% of increase, and the threshold voltage has no significant fluctuation. The reason resides in that Si has not been activated at the high temperature after the ion implantation is performed on Si, and the particles are present on the surface of SiC. In addition, the low-energy implantation cannot damage the surface lattice integrity, the Si atoms required by the oxidation reaction are partially provided by the implanted particles and the damage to the original SiC bonds is decreased, so that the broken bonds generated upon oxidation reaction is decreased to decrease $D_{it}$, wherein the Si is neutrally doped and cannot cause too high variation to the threshold voltage. FIGS. 7a to 7d show the $I_d V_g$ and $I_d V_d$ measurement results of the representative elements under two process conditions, wherein FIGS. 7a and 7c show those for the conventional standard process, and FIGS. 7b and 7d show those for the silicon ion implantation process of the invention.

TABLE 5 average electron mobility and threshold voltage under different processes

|  | Standard | Si-implant |
|---|---|---|
| $\mu_{FE}$(cm²/V · s) | 6.38 ± 0.4 | 7.59 ± 0.3 |
| $V_{TH}$(V) @$I_d$ = 1 μA | 8.8 | 8.8 |

Figure 8A:
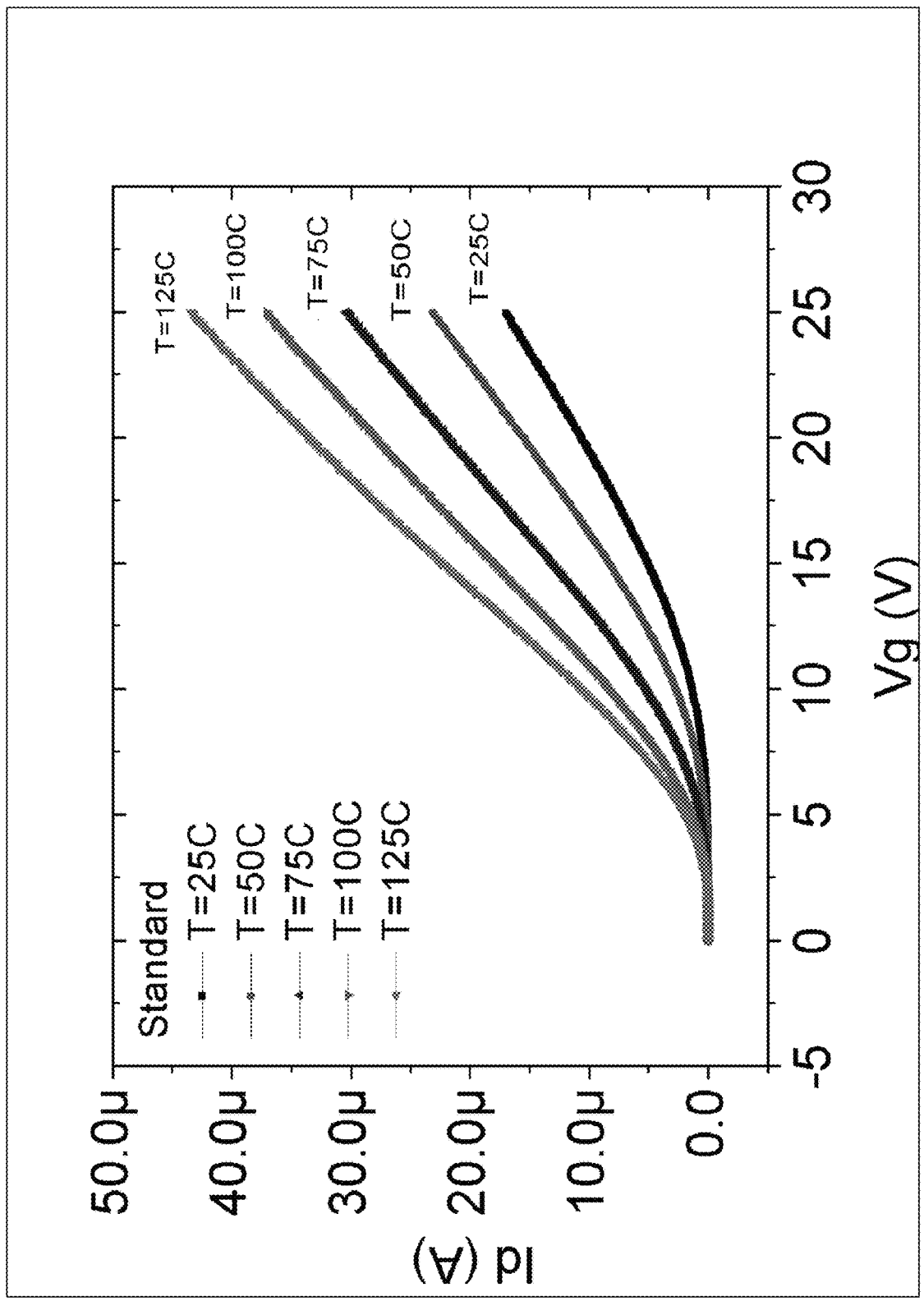
FIGS. 8a and 8b show I$_d$V$_g$ for variable temperatures.
Figure 8B:
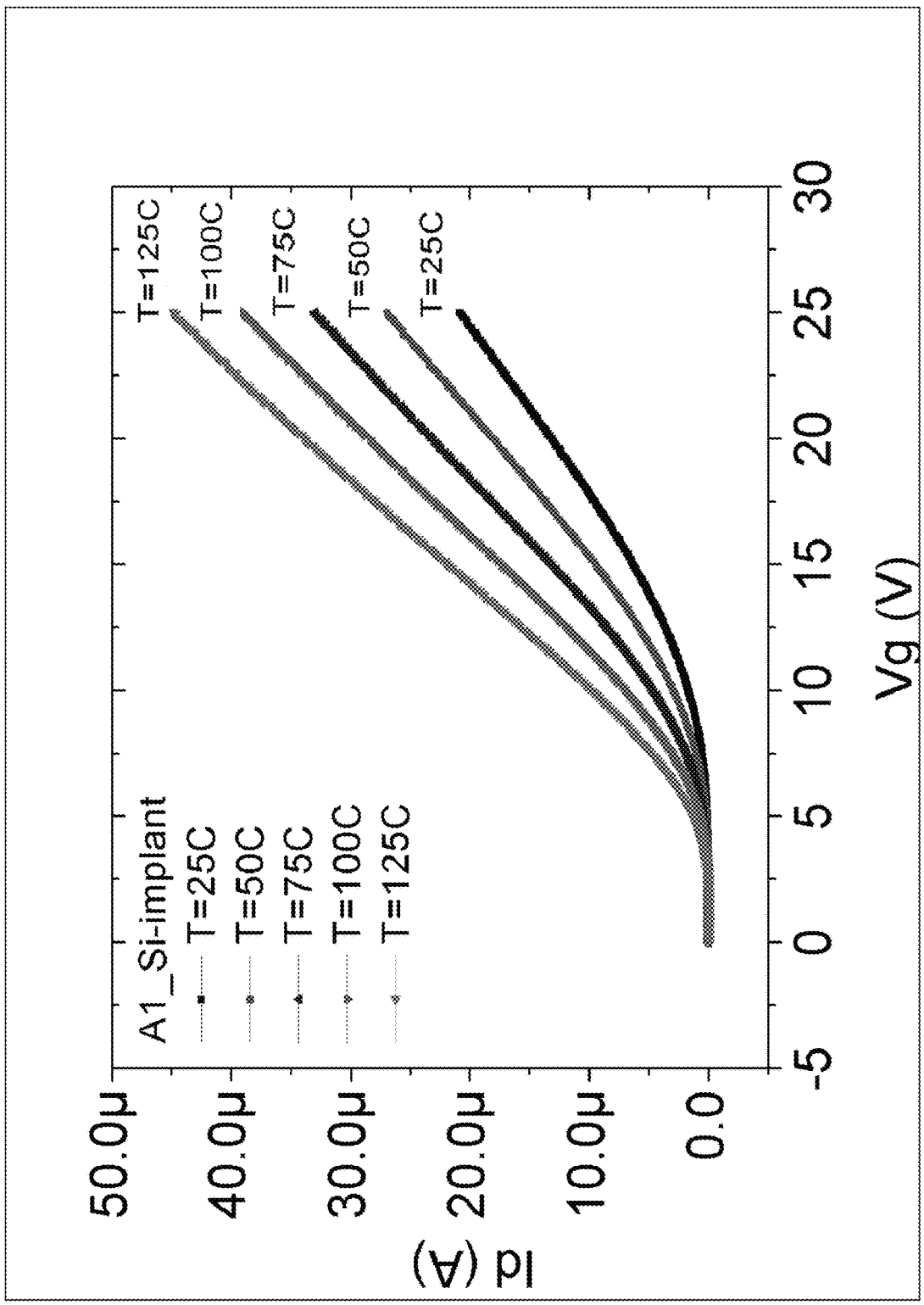

The variable temperature electrical property measurement is performed. FIGS. 8a and 8b show the variable temperature $I_d V_g$, wherein FIG. 8a shows that for the conventional standard process, and FIG. 8b show that for the silicon ion implantation process of the invention. With the increase of the temperature, the current is increased, the electron mobility is increased, and the threshold voltage is decreased. Because SiC has the high-density interface trap electrons, the increase of the temperature can effectively release the trapped electrons, so that the channel electron concentration is increased, the channel inversion can be achieved more easily, the threshold voltage is decreased, and the electron mobility is increased. It is worth noting that the specimen obtained after the Si ion implantation has the decrease of the threshold voltage slower than that of the specimen obtained after the standard process, and it is easier to prevent the element from entering the normally open mode early. The detailed variable temperature data are arranged in Table 6 and Table 7.

TABLE 6 variable temperature measurement for standard process

| Standard | Mobility (cm2/V · s) | $V_{TH}$@Id = 1 μA (V) | N-Rsh (Ω/Square) | P-Rsh (Ω/Square) |
|---|---|---|---|---|
| 25° C. | 6.38 | 8.8 | 74.3 | 4330 |
| 50° C. | 7.70 | 7.1 | 75.1 | 3530 |
| 75° C. | 8.74 | 5.4 | 77.3 | 2970 |
| 100° C. | 9.68 | 4.1 | 80.8 | 2450 |
| 125° C. | 10.89 | 3.7 | 80.2 | 2130 |

TABLE 7

Si-implant variable temperature measurement

| Si-implant | Mobility (cm²/V · s) | $V_{TH}$@Id = 1 μA (V) | N-Rsh (Ω/Square) | P-Rsh (Ω/Square) |
|---|---|---|---|---|
| 25° C. | 7.59 | 8.8 | 80 | 4130 |
| 50° C. | 9.01 | 7.5 | 80.5 | 3740 |
| 75° C. | 9.95 | 6.3 | 80.5 | 2890 |
| 100° C. | 11.25 | 5.4 | 85.7 | 2420 |
| 125° C. | 11.96 | 4.6 | 88 | 2110 |

In this invention, the surface property is changed by way of Si ion implantation before the oxidation process, so that the oxidation environment is improved, and the electron mobility of the SiC horizontal metal-oxide-semiconductor field-effect transistor is increased.

The Si ion implantation before oxidation is performed to increase the field-effect mobility from the original 6.38 cm²/V·s to 7.59 cm²/V·s, the increase is about 15%, and the average interface trap density is also decreased from 4.079× $10^{12}$ eV$^{-1}$ cm$^{-2}$ to 3.764×$10^{12}$ eV$^{-1}$ cm$^{-2}$. Although there is no such great increase of the electron mobility caused by the NO thermal annealing, the aftereffect of the threshold voltage offset is avoided without affecting other electrical properties, such as the Ohmic contact and the like.

What is claimed is:

1. A structure of a metal-oxide-semiconductor field-effect transistor with an element of IVA group ion implantation, comprising:
    a body;
    a gate electrode, wherein a gate oxide layer is disposed between the gate electrode and the body; and
    an element of IVA group ion implantation layer, which is disposed in the body and close to an interface between the gate oxide layer and the body;
    wherein the element of IVA group ion implantation layer is utilized to change a property of a channel of the structure; and an IVA group ion are implanted into a SiC layer to form the element of IVA group ion implantation layer.

2. The structure according to claim 1, wherein a property of the channel comprises an electron mobility of the channel and a threshold voltage ($V_{TH}$).

3. The structure according to claim 2, wherein the element of IVA group ion implantation layer increases bonds of the body.

4. The structure according to claim 3, wherein the element of IVA group ion implantation layer is a silicon ion implantation layer.

5. The structure according to claim 4, wherein the silicon ion implantation layer is not disposed on the gate oxide layer.

6. The structure according to claim 5, further comprising:
    a source layer disposed on a top surface of the body;
    a source electrode disposed on a top surface of the source layer, and in contact with a sidewall of the gate oxide layer, wherein the source electrode partially covers the source layer;
    a drain layer disposed on the top surface of the body; and
    a drain electrode disposed on a top surface of the drain layer and in contact with an other sidewall of the gate oxide layer, wherein the drain electrode partially covers the drain layer;
    wherein the gate oxide layer partially covers the source layer, partially covers the drain layer and partially covers the body; the source layer and the drain layer are made of a first type semiconductor material; the body is made of a second type semiconductor material; and the silicon ion implantation layer is disposed in the source layer and the drain layer, and the silicon ion implantation layer is close to an interface between the source layer and the source electrode, an interface between the source layer and the gate oxide layer, an interface between the drain layer and the drain electrode, and an interface between the drain layer and the gate oxide layer.

7. The structure according to claim 5, further comprising:
    a source layer disposed on a top surface of the body, wherein the source layer is partially covered by the body;
    a source electrode disposed on a top surface of the source layer and in contact with a sidewall of the gate oxide layer, wherein the source electrode partially covers the source layer;
    a drift layer, which is disposed on and in contact with a bottom surface of the gate oxide layer and covers the body;
    a substrate, which is in contact with and disposed below the drift layer; and
    a drain electrode disposed below the substrate;
    wherein the gate oxide layer partially covers the source layer, partially covers the body and partially covers the drift layer; the source layer, the drift layer and the substrate are made of a first type semiconductor material; the body is made of a second type semiconductor material; and the silicon ion implantation layer is disposed in the source layer and the drift layer and is close to an interface between the source layer and the source electrode, an interface between the source layer and the gate oxide layer, and an interface between the drift layer and the gate oxide layer.

8. The structure according to claim 5, further comprising:
    a metal layer disposed on a top surface and on a bottom surface of the structure to form a source electrode and a drain electrode;
    a substrate disposed above the drain electrode;
    a drift layer disposed above the substrate;
    a body disposed above the drift layer;
    a source layer disposed above the body;
    a trench extending through the body and the source layer, wherein a bottom portion of the trench terminates at the drift layer, the gate oxide layer is disposed in the trench, and the gate electrode is covered by the gate oxide layer;
    wherein the gate oxide layer partially covers the source layer, partially covers the body and partially covers the drift layer; the source layer, the drift layer and the substrate are made of a first type semiconductor material; the body is made of a second type semiconductor material; and the silicon ion implantation layer is disposed in the source layer and the drift layer and is close to an interface between the body and the source electrode, an interface between the source layer and the source electrode, an interface between the source layer and the gate oxide layer, and an interface between the drift layer and the gate oxide layer.

* * * * *